(12) United States Patent
Platzgummer et al.

(10) Patent No.: US 9,653,263 B2
(45) Date of Patent: May 16, 2017

(54) MULTI-BEAM WRITING OF PATTERN AREAS OF RELAXED CRITICAL DIMENSION

(71) Applicant: IMS Nanofabrication AG, Vienna (AT)

(72) Inventors: Elmar Platzgummer, Vienna (AT); Klaus Schiessl, Vienna (AT)

(73) Assignee: IMS Nanofabrication AG (AT)

( * ) Notice: Subject to any disclaimer, the term of this patent is extended or adjusted under 35 U.S.C. 154(b) by 0 days.

(21) Appl. No.: 15/073,200

(22) Filed: Mar. 17, 2016

(65) Prior Publication Data

US 2016/0276132 A1    Sep. 22, 2016

Related U.S. Application Data

(60) Provisional application No. 62/134,463, filed on Mar. 17, 2015.

(51) Int. Cl.
*G03B 27/52* (2006.01)
*H01J 37/10* (2006.01)
(Continued)

(52) U.S. Cl.
CPC ...... *H01J 37/3177* (2013.01); *H01J 37/3026* (2013.01); *H01J 2237/31764* (2013.01); *H01J 2237/31769* (2013.01)

(58) Field of Classification Search
CPC .......... B82Y 10/00; B82Y 40/00; H01J 21/24; H01J 37/045; H01J 37/28; H01J 37/3174;
(Continued)

(56) References Cited

U.S. PATENT DOCUMENTS

| 1,033,741 A | 7/1912 | Sims |
| 1,420,104 A | 6/1922 | Howe et al. |

(Continued)

FOREIGN PATENT DOCUMENTS

| CN | 202204836 U | 4/2012 |
| EP | 0178156 A2 | 4/1986 |

(Continued)

OTHER PUBLICATIONS

US 9,443,052, 09/2016, Platzgummer et al. (withdrawn)
(Continued)

*Primary Examiner* — David A Vanore
(74) *Attorney, Agent, or Firm* — KPPB LLP

(57) ABSTRACT

To irradiate a target with a beam of energetic electrically charged particles, the beam is formed and imaged onto a target, where it generates a pattern image composed of pixels. For a pattern which comprises a primary pattern region to be written with a predetermined primary feature size and a secondary pattern region which is composed of structure features capable of being written with a secondary feature size, larger than the primary feature size. The structure features of the primary pattern region are written by exposing a plurality of exposure spots on grid positions of a first exposure grid; the structure features in the secondary pattern region are written by exposing a plurality of exposure spots on grid positions of a second exposure grid according to a second arrangement which is coarser that the regular arrangement of the first exposure grid.

14 Claims, 13 Drawing Sheets

(51) Int. Cl.
  *H01J 37/317* (2006.01)
  *H01J 37/302* (2006.01)

(58) Field of Classification Search
  CPC ...... H01J 37/3026; H01J 37/3177; H01J 3/36;
      G03F 7/70183; G03F 7/70216; G03F
      7/70225; G03F 7/70233; G03F 7/70241;
      G03F 7/70275; G03F 7/70291; G03F
      7/70308; G03F 7/70391; G03F 7/704;
      G03F 7/707; G03F 7/70708; G03F
      7/70791
  USPC ............ 250/396 R, 492.2, 492.22; 315/364;
      330/4.7, 308
  See application file for complete search history.

(56) References Cited

U.S. PATENT DOCUMENTS

| | | | |
|---|---|---|---|
| 1,903,005 A | 3/1933 | McCuen | |
| 2,187,427 A | 1/1940 | Middleton | |
| 2,820,109 A | 1/1958 | Dewitz | |
| 2,920,104 A | 1/1960 | Brooks et al. | |
| 3,949,265 A | 4/1976 | Holl | |
| 4,467,211 A | 8/1984 | Smith | |
| 4,735,881 A | 4/1988 | Kobayashi et al. | |
| 4,899,060 A | 2/1990 | Lischke | |
| 5,103,101 A | 4/1992 | Berglund et al. | |
| 5,260,579 A | 11/1993 | Yasuda et al. | |
| 5,369,282 A | 11/1994 | Arai et al. | |
| 5,399,872 A | 3/1995 | Yasuda et al. | |
| 5,814,423 A | 9/1998 | Maruyama et al. | |
| 5,841,145 A | 11/1998 | Satoh et al. | |
| 5,847,959 A | 12/1998 | Veneklasen et al. | |
| 5,857,815 A | 1/1999 | Bailey et al. | |
| 5,876,902 A | 3/1999 | Veneklasen | |
| 5,933,211 A | 8/1999 | Nakasugi et al. | |
| 6,014,200 A | 1/2000 | Sogard et al. | |
| 6,043,496 A | 3/2000 | Tennant | |
| 6,049,085 A | 4/2000 | Ema | |
| 6,111,932 A | 8/2000 | Dinsmore | |
| 6,137,113 A | 10/2000 | Muraki | |
| 6,225,637 B1 | 5/2001 | Terashima et al. | |
| 6,229,595 B1 * | 5/2001 | McKinley | G03F 7/70216 355/53 |
| 6,252,339 B1 | 6/2001 | Kendall | |
| 6,280,798 B1 | 8/2001 | Ring et al. | |
| 6,333,138 B1 | 12/2001 | Higashikawa et al. | |
| 6,472,673 B1 | 10/2002 | Chalupka et al. | |
| 6,473,237 B2 | 10/2002 | Mei | |
| 6,552,353 B1 | 4/2003 | Muraki et al. | |
| 6,617,587 B2 | 9/2003 | Parker | |
| 6,767,125 B2 | 7/2004 | Midas et al. | |
| 6,768,123 B2 | 7/2004 | Giering | |
| 6,768,125 B2 | 7/2004 | Platzgummer et al. | |
| 6,786,125 B2 | 9/2004 | Imai | |
| 6,835,937 B1 | 12/2004 | Muraki et al. | |
| 6,858,118 B2 | 2/2005 | Platzgummer et al. | |
| 6,897,454 B2 | 5/2005 | Sasaki et al. | |
| 6,965,153 B1 | 11/2005 | Ono et al. | |
| 7,084,411 B2 | 8/2006 | Lammer-Pachlinger et al. | |
| 7,124,660 B2 | 10/2006 | Chiang | |
| 7,129,024 B2 | 10/2006 | Ki | |
| 7,199,373 B2 | 4/2007 | Stengl et al. | |
| 7,201,213 B2 | 4/2007 | Leeson | |
| 7,214,951 B2 | 5/2007 | Stengl et al. | |
| 7,276,714 B2 | 10/2007 | Platzgummer et al. | |
| 7,446,601 B2 * | 11/2008 | LeChevalier | H01J 3/36 315/364 |
| 7,459,247 B2 | 12/2008 | Bijnen et al. | |
| 7,671,687 B2 * | 3/2010 | LeChevalier | H01J 3/36 315/364 |
| 7,687,783 B2 | 3/2010 | Platzgummer et al. | |
| 7,710,634 B2 | 5/2010 | Sandstrom | |
| 7,714,298 B2 | 5/2010 | Platzgummer et al. | |
| 7,741,620 B2 | 6/2010 | Doering et al. | |
| 7,772,574 B2 | 8/2010 | Stengl et al. | |
| 7,777,201 B2 | 8/2010 | Fragner et al. | |
| 7,781,748 B2 | 8/2010 | Platzgummer et al. | |
| 7,823,081 B2 | 10/2010 | Sato et al. | |
| 8,057,972 B2 | 11/2011 | Fragner et al. | |
| 8,183,543 B2 | 5/2012 | Platzgummer et al. | |
| 8,198,601 B2 | 6/2012 | Platzgummer et al. | |
| 8,222,621 B2 | 7/2012 | Fragner et al. | |
| 8,227,768 B2 | 7/2012 | Smick et al. | |
| 8,257,888 B2 | 9/2012 | Sczyrba et al. | |
| 8,258,488 B2 | 9/2012 | Platzgummer et al. | |
| 8,294,117 B2 | 10/2012 | Kruit et al. | |
| 8,304,749 B2 | 11/2012 | Platzgummer et al. | |
| 8,378,320 B2 | 2/2013 | Platzgummer | |
| 8,502,174 B2 | 8/2013 | Wieland | |
| 8,531,648 B2 * | 9/2013 | De Jager | G03F 7/70275 355/55 |
| 8,546,767 B2 * | 10/2013 | Platzgummer | B82Y 10/00 250/396 R |
| 8,563,942 B2 | 10/2013 | Platzgummer | |
| 8,598,544 B2 | 12/2013 | Van De Peut et al. | |
| 9,053,906 B2 | 6/2015 | Platzgummer | |
| 9,093,201 B2 | 7/2015 | Platzgummer et al. | |
| 9,099,277 B2 | 8/2015 | Platzgummer | |
| 9,188,874 B1 | 11/2015 | Johnson | |
| 9,269,543 B2 | 2/2016 | Reiter et al. | |
| 9,335,638 B2 * | 5/2016 | De Jager | G03B 27/52 355/52 |
| 9,373,482 B2 | 6/2016 | Platzgummer | |
| 9,443,699 B2 | 9/2016 | Platzgummer et al. | |
| 9,495,499 B2 | 11/2016 | Platzgummer et al. | |
| 9,520,268 B2 | 12/2016 | Platzgummer | |
| 9,568,907 B2 | 2/2017 | Platzgummer et al. | |
| 2001/0028038 A1 | 10/2001 | Hamaguchi et al. | |
| 2002/0021426 A1 | 2/2002 | Mei et al. | |
| 2002/0148978 A1 | 10/2002 | Innes et al. | |
| 2003/0085360 A1 | 5/2003 | Parker et al. | |
| 2003/0106230 A1 | 6/2003 | Hennessey | |
| 2003/0155534 A1 | 8/2003 | Platzgummer et al. | |
| 2003/0160980 A1 | 8/2003 | Olsson et al. | |
| 2004/0058536 A1 | 3/2004 | Ki | |
| 2004/0119021 A1 | 6/2004 | Parker et al. | |
| 2004/0157407 A1 | 8/2004 | Tong et al. | |
| 2004/0169147 A1 | 9/2004 | Ono et al. | |
| 2005/0063510 A1 | 3/2005 | Hieronimi et al. | |
| 2005/0072941 A1 | 4/2005 | Tanimoto et al. | |
| 2005/0104013 A1 | 5/2005 | Stengl et al. | |
| 2005/0242302 A1 | 11/2005 | Platzgummer et al. | |
| 2005/0242303 A1 | 11/2005 | Platzgummer | |
| 2006/0060775 A1 | 3/2006 | Sakakibara et al. | |
| 2006/0076509 A1 | 4/2006 | Okino et al. | |
| 2006/0169925 A1 | 8/2006 | Miyajima et al. | |
| 2007/0138374 A1 | 6/2007 | Nishibashi et al. | |
| 2007/0178407 A1 | 8/2007 | Hatakeyama et al. | |
| 2007/0279768 A1 | 12/2007 | Shibazaki et al. | |
| 2008/0024745 A1 | 1/2008 | Baselmans | |
| 2008/0080782 A1 | 4/2008 | Olsson et al. | |
| 2008/0099693 A1 | 5/2008 | Platzgummer et al. | |
| 2008/0105827 A1 | 5/2008 | Tamamushi | |
| 2008/0128638 A1 | 6/2008 | Doering et al. | |
| 2008/0142728 A1 | 6/2008 | Smick et al. | |
| 2008/0198352 A1 | 8/2008 | Kugler et al. | |
| 2008/0203317 A1 | 8/2008 | Platzgummer et al. | |
| 2008/0237460 A1 | 10/2008 | Fragner et al. | |
| 2008/0257096 A1 | 10/2008 | Zhu et al. | |
| 2008/0260283 A1 | 10/2008 | Ivansen | |
| 2008/0283767 A1 | 11/2008 | Platzgummer | |
| 2008/0299490 A1 | 12/2008 | Takekoshi | |
| 2009/0032700 A1 | 2/2009 | Park et al. | |
| 2009/0101816 A1 | 4/2009 | Noji et al. | |
| 2009/0256075 A1 | 10/2009 | Kemen et al. | |
| 2009/0321631 A1 | 12/2009 | Smick et al. | |
| 2010/0127185 A1 | 5/2010 | Fragner et al. | |
| 2010/0178602 A1 | 7/2010 | Seto et al. | |
| 2010/0187434 A1 | 7/2010 | Platzgummer et al. | |
| 2010/0288938 A1 | 11/2010 | Platzgummer | |
| 2011/0053087 A1 | 3/2011 | Nielsen et al. | |
| 2011/0073782 A1 | 3/2011 | Wieland | |

(56) References Cited

U.S. PATENT DOCUMENTS

| | | | |
|---|---|---|---|
| 2011/0204253 A1* | 8/2011 | Platzgummer | B82Y 10/00 250/396 R |
| 2011/0226968 A1 | 9/2011 | Platzgummer | |
| 2012/0076269 A1 | 3/2012 | Roberts et al. | |
| 2012/0085940 A1 | 4/2012 | Matsumoto | |
| 2012/0211674 A1 | 8/2012 | Kato | |
| 2012/0286169 A1 | 11/2012 | Van de Peut et al. | |
| 2012/0286170 A1 | 11/2012 | Van de Peut et al. | |
| 2012/0288787 A1 | 11/2012 | Choi et al. | |
| 2013/0157198 A1 | 6/2013 | Ogasawara et al. | |
| 2013/0164684 A1 | 6/2013 | Yamanaka | |
| 2013/0198697 A1 | 8/2013 | Hotzel et al. | |
| 2013/0252145 A1 | 9/2013 | Matsumoto et al. | |
| 2013/0253688 A1 | 9/2013 | Matsumoto et al. | |
| 2014/0042334 A1 | 2/2014 | Wieland | |
| 2014/0197327 A1 | 7/2014 | Platzgummer | |
| 2014/0240732 A1 | 8/2014 | Tinnemans et al. | |
| 2014/0322927 A1 | 10/2014 | Morita | |
| 2014/0346369 A1 | 11/2014 | Matsumoto | |
| 2015/0021493 A1 | 1/2015 | Platzgummer | |
| 2015/0028230 A1 | 1/2015 | Platzgummer | |
| 2015/0069260 A1 | 3/2015 | Platzgummer | |
| 2015/0243480 A1 | 8/2015 | Yamada et al. | |
| 2015/0248993 A1 | 9/2015 | Reiter et al. | |
| 2015/0311030 A1 | 10/2015 | Platzgummer et al. | |
| 2015/0311031 A1 | 10/2015 | Platzgummer et al. | |
| 2015/0347660 A1 | 12/2015 | Platzgummer et al. | |
| 2016/0012170 A1 | 1/2016 | Platzgummer | |
| 2016/0013019 A1 | 1/2016 | Platzgummer | |
| 2016/0071684 A1 | 3/2016 | Platzgummer et al. | |
| 2016/0276131 A1 | 9/2016 | Platzgummer | |
| 2016/0276132 A1* | 9/2016 | Platzgummer | H01J 37/3177 |
| 2016/0336147 A1 | 11/2016 | Platzgummer | |

FOREIGN PATENT DOCUMENTS

| | | |
|---|---|---|
| EP | 1033741 A2 | 9/2000 |
| EP | 2019415 A1 | 1/2009 |
| EP | 2187427 A2 | 5/2010 |
| EP | 2214194 A1 | 8/2010 |
| EP | 2317535 A2 | 5/2011 |
| EP | 2363875 A1 | 9/2011 |
| GB | 2349737 A | 11/2000 |
| JP | 08213301 A | 8/1996 |
| JP | 2006019436 A | 1/2006 |
| JP | 2006332289 | 12/2006 |
| WO | 2006084298 A1 | 8/2006 |
| WO | 2008053140 A1 | 5/2008 |
| WO | 2009147202 | 12/2009 |
| WO | 2012172913 A1 | 12/2012 |

OTHER PUBLICATIONS

European Search Report for Application 08450077.6, report dated Jan. 29, 2010, 2 pgs.
European Search Report for Application 09450211.9-1226, report dated Sep. 14, 2010, 4 pgs.
European Search Report for Application 09450212.7, Report dated Sep. 28, 2010, 9 pgs.
European Search Report for Application 141501197.7, report dated Jun. 6, 2014, 2 pgs.
European Search Report for Application 14165967, report dated Oct. 30, 2014, 2 pgs.
European Search Report for Application 14165970, report dated Jun. 18, 2014, 2 pgs.
European Search Report for Application 14170611, report dated Nov. 4, 2014, 3 pgs.
European Search Report for Application 14176563, report dated Jan. 14, 2015, 2 pgs.
European Search Report for Application 14177851, report dated Oct. 16, 2014, 1 page.
European Search Report for Application 14199183, report dated Jun. 19, 2015, 2 pgs.
European Search Report for Application 15164770, report dated Sep. 18, 2015, 2 pgs.
European Search Report for Application 15164772, report dated Sep. 11, 2015, 2 pgs.
European Search Report for Application 15169632, report dated Oct. 20, 2015, 3 pgs.
European Search Report for Application 15171348, report dated Oct. 30, 2015, 2 pgs.
European Search Report for Application 14176645, report dated Dec. 1, 2014, 1 pg.
European Search Report for European Application 10450070.7, Report dated May 7, 2012, 13 pgs.
Berry et al., "Programmable aperture plate for maskless high-throughput nanolithography", J. Vac. Sci. Technol., Nov./Dec. 1997, vol. B15, No. 6, pp. 2382-2386.
Borodovsky, Yan, "EUV, EBDW—ARF Replacement or Extension?", KLA-Tencor Lithography User Forum, Feb. 21, 2010, San Jose, CA, USA.
Borodovsky, Yan, "MPProcessing for MPProcessors", SEMATECH Maskless Lithography and Multibeam Mask Writer Workshop, May 10, 2010, New York, NY, USA.
Disclosed Anonymously, "Multi-tone rasterization, dual pass scan, data path and cell based vector format", IPCOM000183472D, printed from ip.com PriorArtDatabase, published May 22, 2009, 108 pages.
Kapl et al., "Characterization of CMOS programmable multi-beam blanking arrays as used for programmable multi-beam projection lithography and resistless nanopatterning", Journal of Micromechanics and Microengineering, 21 (2001), pp. 1-8.
Li, H. Y. et al., "Through-Silicon Interposer Technology for Heterogeneous Integration", Future Fab Intl., Issue 45, Apr. 25, 2013.
Paraskevopoulos, A. et al., "Scalable (24—140 Gbps) optical data link, well adapted for future maskless lithography applications", Proc. SPIE vol. 7271, 72711 I, 2009.
Platzgummer, Elmar et al., "EMET POC: Realization of a proof-of-concept 50 keV electron multibeam Mask Exposure Tool", Proc. of SPIE vol. 8166, 816622-1, 2011.
Platzgummer et al., "EMET—50keV electron Mask Exposure Tool Development based on proven multi-beam projection technology", Proc. of SPIE, vol. 7823, pp. 782308-1-782308-12.
Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.
European Search Report for Eureopean Application No. 16160622, Search completed Jul. 21, 2016, Mailed Jul. 21, 2016, 3Pgs.
Wheeler et al., "Use of Electron Beams in VLSI", G.E.C.Journal of Science and Technology, General Electric Company. Wembley, Middlesex, GB, vol. 48, No. 2, Jan. 1, 1982 (Jan. 1, 1982), pp. 103-107, XP000820522.
European Search Report for Application 15159397.7, report dated Sep. 28, 2015, 8 pgs.
European Search Report for Application 15159617.8, report dated Oct. 19, 2015, 4 pgs.
Wheeler et al., "Use of Electron Beams in VLSI", G.E.C. Journal of Science and Technology, General Electric Company. Wembley, Middlesex, GB, vol. 48, No. 2, Jan. 1, 1982, pp. 103-107, XP000820522.

* cited by examiner

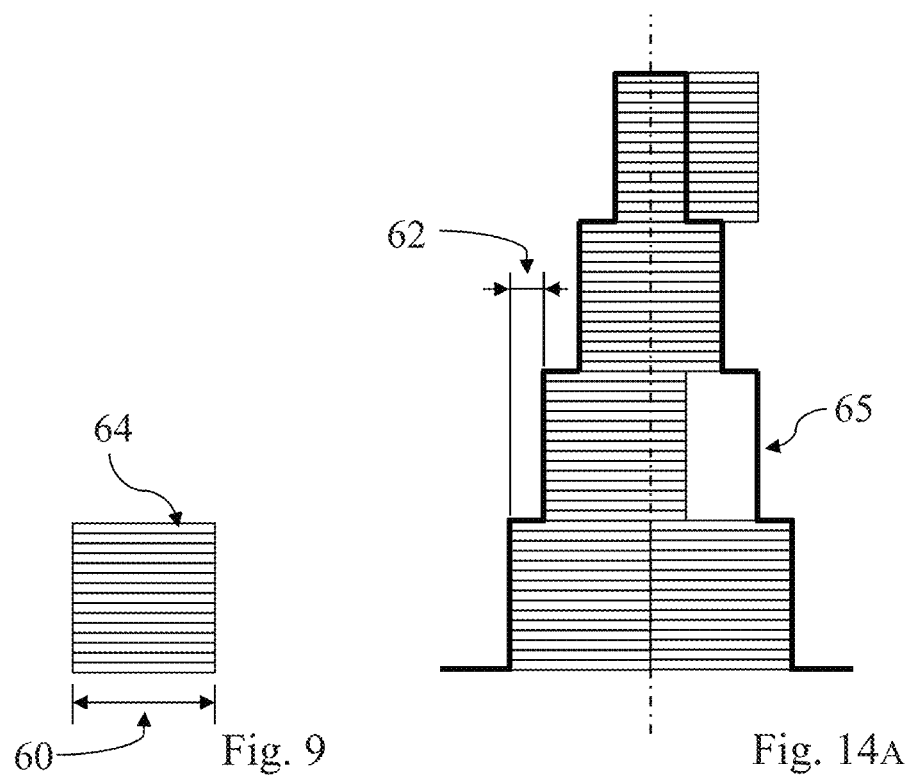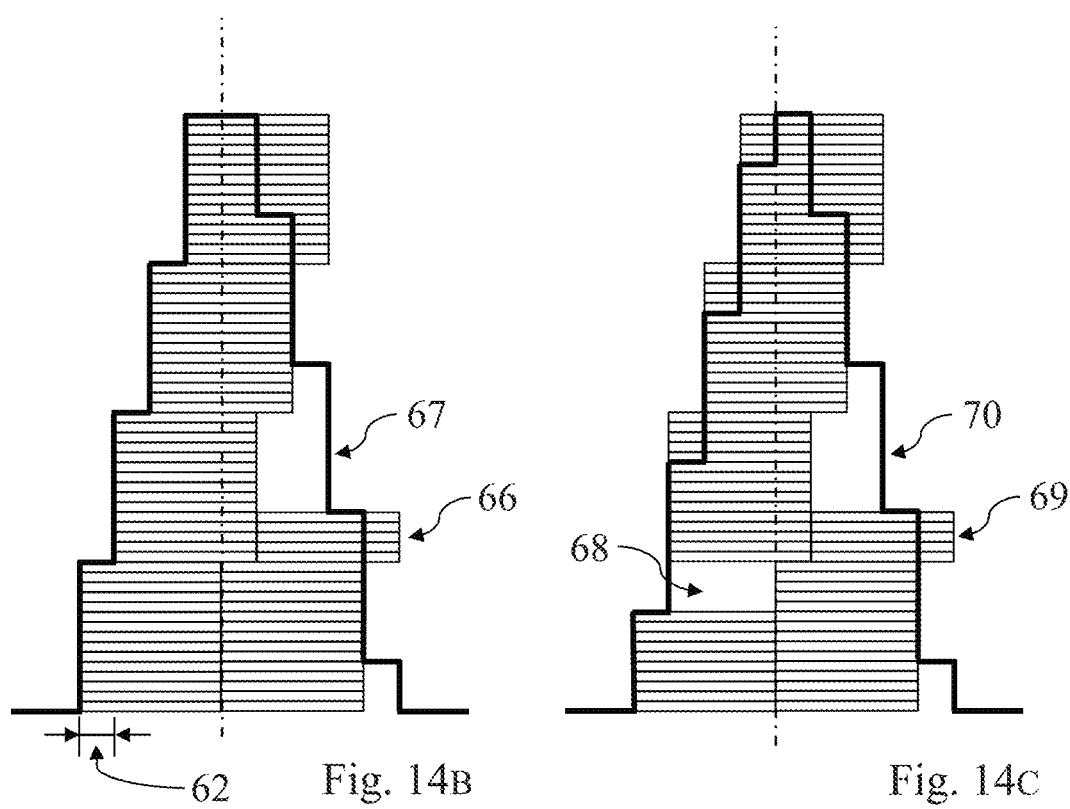

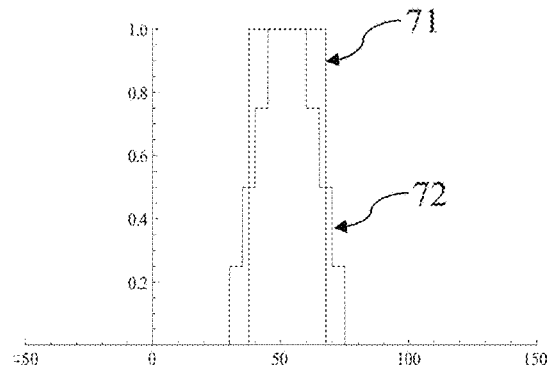
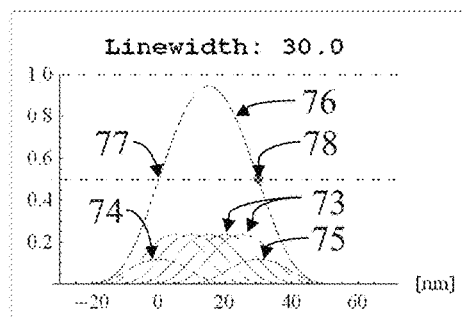
Fig. 10      Fig. 11
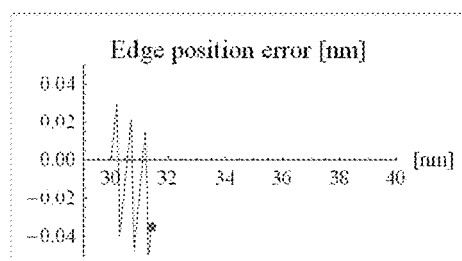
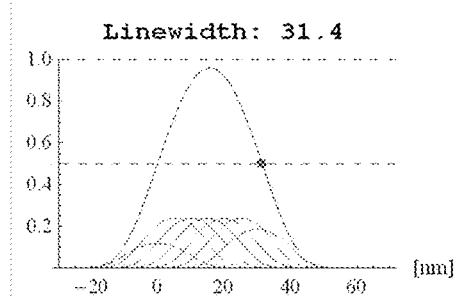
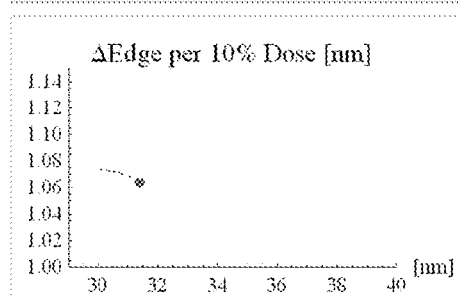
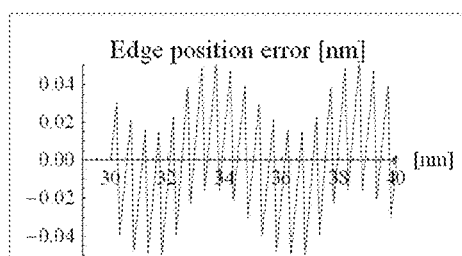
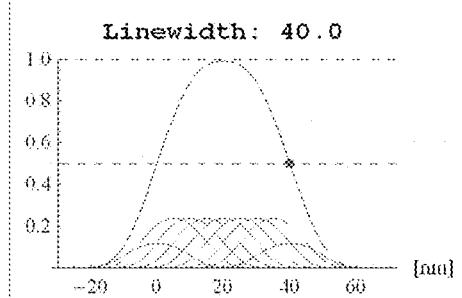
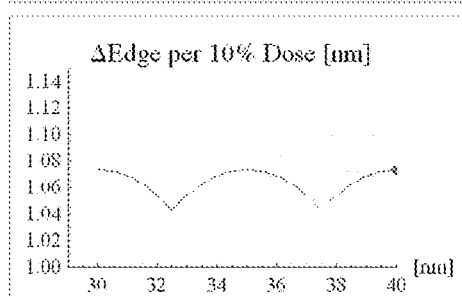
Fig. 12A      Fig. 12B ΔEdge per 10% Dose: 2.7 nm ΔEdge per 10% Dose: 1.4 nm

MULTI-BEAM WRITING OF PATTERN AREAS OF RELAXED CRITICAL DIMENSION

CROSS-REFERENCE TO RELATED APPLICATIONS

The current application claims priority to U.S. Provisional Application No. 62/134,463, filed Mar. 17, 2015, the disclosure of which is incorporated herein by reference.

FIELD OF THE INVENTION AND DESCRIPTION OF PRIOR ART

Many embodiments of the invention relate to a method for forming a pattern on a surface of a substrate or target by means of a beam of energetic electrically charged particles using a charged-particle multi-beam processing apparatus. More in detail, certain embodiments of the invention relate to a method for irradiating a target with a beam of energetic radiation formed by electrically charged particles for writing a desired pattern on said target, comprising the steps of
  providing a pattern definition means having a plurality of apertures transparent to said radiation,
  illuminating said pattern definition means by means of an illuminating wide beam, which traverses the pattern definition means through said apertures thus forming a patterned beam consisting of a corresponding plurality of beamlets,
  forming said patterned beam into a pattern image on the location of the target, said pattern image comprising the images of at least part of the plurality of apertures covering a number of pattern pixels on the target, and
  generating a relative movement between said target and the pattern definition means producing a stepwise movement of said pattern image on the target along a path over a region where a beam exposure is to be performed, exposing a plurality of pattern pixels in said region.

Methods of the above-described type and charged-particle multi-beam processing apparatuses employing such methods are well-known in prior art. In particular, the applicant has realized charged-particle multi-beam devices as described in several patents in the name of the applicant with respect to the charged-particle optics, pattern definition (PD) device, and multi-beam writing methods employed therein. For instance, a 50 keV electron multi-beam writer which allows to realize leading-edge complex photomasks for 193 nm immersion lithograph, of masks for EUV lithography and of templates (1× masks) for imprint lithography, has been implemented, called eMET (electron Mask Exposure Tool) or MBMW (multi-beam mask writer), for exposing 6" mask blank substrates. Moreover, a multi-beam system also referred to as PML2 (Projection Mask-Less Lithography) was implemented for electron beam direct write (EBDW) applications on Silicon wafer substrates. Multi-beam processing apparatuses of the said kind are hereinafter referred to as multi-beam writer, or short MBW.

As a typical implementation of an MBW, the applicant has realized a 50 keV electron writer tool implementing a total beam size of 20 nm comprising 512×512 (=262,144) programmable beamlets within a beam array field of dimensions 81.92 μm×81.92 μm at the substrate. In this system, which is referred to as "MBMW tool" hereinafter, the substrate is, typically, a 6" mask blank (having an area of 6"×6"=152.4 mm×152.4 mm and thickness 6"/4=6.35 mm) covered with an electron beam sensitive resist; furthermore, multi-beam writing is possible on resist-covered 150 mm Si wafers as well.

The current density of a typical MBW, such as the MBMW tool, is no higher than 1 A/cm$^2$. When using 20 nm beam size and all programmable 262,144 beamlets are "on" the maximum current is 1.05 μA. In this implementation the 1 sigma blur of the MBW column is approx. 5 nm, as verified experimentally.

There is the possibility to change the beam size, e.g., from 20 nm to 10 nm. For a column with 200:1 reduction this is straightforward by using a different aperture array plate (AAP), with 2 μm×2 μm opening size of the apertures instead of 4 μm×4 μm opening size. As outlined in U.S. Pat. No. 8,546,767 of the applicant, a change of the beam size may also be realized in-situ by spatial adjustment of the AAP having multiple aperture arrays of different geometric parameters, such a total size, aperture spacing, aperture shapes etc.

When using a 10 nm beam size and providing a current density at the substrate of no higher than 4 A/cm$^2$, the current of 262,144 programmable beamlets (with all beamlets "on") is again 1.05 μA at maximum. Thus, also in this case there is virtually no change of the 1 sigma blur of the column with current through the column.

The first generation MBW production machines are targeted to use 20 nm and 10 nm beams providing up to approx. 1 μA current for all 262,144 programmable beams "on". For following generations of MBW production machines there is the plan to use even smaller beam size, for instance of 8 nm, and concurrently to provide e.g. 640×640=409,600 beamlets within the 81.92 μm×81.92 μm beam array field at the substrate. Keeping the maximum current density at 4 A/cm$^2$ will ensure that the maximum current (with all beamlets "on") is 1.05 μA. For instance, using a 5 nm beam size allows providing e.g. 1024×1024=1,048,576 programmable beams within the mentioned beam array field at the substrate; again, at a maximum current density of 4 A/cm$^2$ the maximum current (with all beamlets "on") is 1.05 μA.

For industrial applications, very demanding MBW performance requirements are imposed with respect to achieving a small Critical Dimension (CD; also referred to a minimum feature size) and, in particular, to achieving 3sigma or 6sigma variations at a nanometer level of the Local CD Uniformity (LCDU) within small fields (e.g. the area of the MBW beam array field) as well as nanometer level 3sigma or 6sigma variations of the Global CD Uniformity (GCDU) over the whole MBW writing field on a substrate (e.g. a 6" mask blank or a 300 mm Silicon wafer).

Furthermore, it is desired to fine-adjust the line edge position by means of a specifically adapted exposure dose profile. Furthermore, such a fine-adjustment should not only be adaptable within the MBW beam array field (local) but also over the whole MBMW writing field on a substrate (global).

Using the MBW architecture of the applicant, low CD values can be achieved and small LCDU and GCDU values. However, in order to fulfill the very demanding MBW specifications of very low LCDU and GCDU values, there is the need for additional fine corrections. Here, the terms "local" and "global" refer again to small fields (e.g. the area of the MBW beam array field) and the whole MBW writing field on a substrate, respectively. Methods to achieve very low LCDU and GCDU values within the substrate exposure field with critical patterns are topic of U.S. Pat. No. 8,222, 621 B2 and US 2015/0028230 A1 of the applicant.

In many applications the structures to be generated on a substrate comprise not only critical patterns within the substrate exposure field (in case of mask or template writing) or several such fields (in case of direct write on e.g. Silicon wafers), but also additional areas having "non-critical patterns" which contain features of considerably larger typical dimension than the CD in the exposure field (s). For instance such non-critical patterns may include bar codes and substrate numbers and similar components, which often are required to be readable to the naked eye.

The area of "non-critical patterns" may be substantial, in particular in the case of photomask substrates. There are very low requirements, if expressed in terms of CD, LCDU and GCDU, of non-critical patterns. While these non-critical patterns are to be written within the same process as the critical patterns, it may be worthwhile to apply relaxed writing constraints, in particular with regard to CD, since this will earn a reduction of the time needed to expose those pattern components.

Therefore, based on a charged-particle multi-beam exposure tool and writing methods possible therein, it is an objective of many embodiments of the invention to find ways for reducing multi-beam writing time of non-critical pattern areas.

SUMMARY OF THE INVENTION

The above-mentioned objective is met by a method as described in the beginning wherein for a pattern which comprises a primary pattern region and a secondary pattern region, where the primary pattern region (which e.g. corresponds to the critical areas) includes structure features being written with a predetermined primary feature size whereas the secondary pattern region (corresponding to e.g. the areas of non-critical features) is composed of structure features capable of being written with a secondary feature size which is larger than the primary feature size by a factor of at least 2 (typically the factor is larger, for instance at least 10 or even more), writing structure features of the primary pattern region comprises exposing a plurality of exposure spots which are located on the target at respective grid positions of a first exposure grid in a regular arrangement, and writing structure features in the secondary pattern region comprises exposing a plurality of exposure spots which are located on the target at respective grid positions of a second exposure grid according to a second arrangement which is coarser that the regular arrangement of the first exposure grid.

This solution allows to write the areas of the secondary pattern region with a less fine-meshed and/or less involved multi-beam writing method, thus saving time of exposure in the areas of the secondary region.

An advantageous development of many embodiments of the invention relates to a suitable choice of the maximum dose (100% level), in particular for the primary pattern region, with respect to the dose value level which causes a positive exposure of exposure spots, viz. the so-called dose-to-size; where generally, writing exposure spots includes imparting an exposure dose to each exposure spot at a value in accordance with a pattern to be produced up to a maximum exposure dose. A suitable choice during writing structure features of the primary pattern region may be that the maximum exposure dose for an exposure spot located within the primary pattern region is greater than the dose-to-size value level, by a factor of 1.5 to 3.0, preferably approximately two, whereas during writing structure features in the secondary pattern region, the maximum exposure dose of an exposure spot located within the secondary pattern region matches, i.e., is equal or only slightly above, the dose-to-size value level.

Furthermore, it may further improve the writing procedure to consider that the maximum exposure dose may include effects of indirect exposure arising from the exposure of neighboring exposure spots, including electron back-scattering effects.

One beneficial application of indirect exposure may be that, in regions that are intended to be exposed below a positive exposure, exposure spots are added an amount of exposure while remaining below the dose-to-size value level (i.e., the dose value level of positive exposure), for generating a background to effect indirect exposure for neighboring exposure spots. Here, the ratio of the dose-to-size value level to the added amount of exposure may suitably range between 1.2 and 2, the ratio value being preferably approx. 1.6.

More specifically, in said regions that are intended to be exposed below a positive exposure it may be suitable to write dose values onto the target with said dose values not exceeding a first threshold value, which is typically the dose-to-size value level, but may be even lower. Further, during writing structure features in the secondary pattern region, the maximum exposure dose of an exposure spot located within the secondary pattern region may be greater than said first threshold value, by a factor greater one but preferably not exceeding 1.5.

A suitable method for calculating the values of exposure dose for the exposure spots in the secondary pattern region so as to produce a pattern to be produced, where writing exposure spots includes imparting an exposure dose thus calculated to each exposure spot at a value in accordance with the pattern to be produced, may include:

- calculating first exposure dose values with regard to grid positions corresponding to the first exposure grid (which is destined to be used in the primary pattern region) extended into the secondary pattern region,
- determining, for each exposure spot in the secondary region, a set of grid positions of the first exposure grid neighboring to the position of the respective exposure spot, and
- calculating, for each exposure spot in the secondary region, a respective second exposure value by applying a weighted sum over the first exposure values of the grid positions in the respective set of grid positions.

In several embodiments of the invention, the second exposure grid may be based on a geometrical grid which is a subset of a geometrical grid on which the first exposure grid is based, and preferably the number of grid positions in the second exposure grid per unit area is smaller than the number of grid positions in the first exposure grid by a factor n, where n≥2 is an integer number, preferably a power of two.

According to another embodiment of the invention, for writing structure features in the primary pattern region and in the secondary pattern region, respectively, different types of apertures in the pattern definition means may be used, where the apertures used with the primary pattern region have smaller areas than the apertures used with the secondary pattern regions, preferably areas smaller by a factor of two or a power of two.

According to yet another embodiment of the invention, for writing structure features in the secondary pattern region where the pattern image is moved on the target along a path within the secondary pattern region, the movement along said path may define a number of stripes covering said region in sequential exposures; said path may be composed of sections which each extend along one of several general directions which are mutually different (i.e., non-parallel), preferably perpendicular.

BRIEF DESCRIPTION OF THE DRAWINGS

In the following, certain embodiments of the present invention are described in more detail with reference to the drawings, which schematically show:

FIG. 8A: "Double Grid", FIG. 8B: "Quad Grid", and FIG. 8C: "Double-Centered Grid";

FIG. 9 illustrate the intensity profile which is generated when one single exposure spot is exposed with a maximum dose;

FIG. 10 illustrates an intensity profile of the MBW of the type shown in FIG. 1, and a dose level profile for a 30 nm line;

FIG. 11 shows an intensity profile for the 30 nm line dose level profile of FIG. 10;

FIGS. 12A and 12B illustrate MBW intensity profiles and related data as obtained for a simulation of a line, with a line width of 31.4 nm (FIG. 12A) and 40.0 nm (FIG. 12B), respectively.

FIG. 14A illustrates the intensity profile generated from the exposure of a line of a determined width;

FIGS. 14B,C illustrate the fine adjustment of the position of one edge (FIG. 14B) or both edges (FIG. 14C) of the line of FIG. 14A via suitable modifications of the dose levels corresponding the exposure spots;

DETAILED DESCRIPTION

The detailed discussion of exemplary embodiments of the invention given below discloses several approaches to minimize the multi-beam writing time of the non-critical pattern area within the framework of the invention. First, a general description of a multi-beam writer (MBW) tool is provided and how to achieve low critical dimension (CD) values and corresponding adequate performance (FIGS. 1-14). Then, a short discussion is presented how to compensate for charged-particle proximity effects, which are prominent when using high energy (e.g. 50 keV) electron beams (FIG. 15), and layout and writing of non-critical pattern areas is discussed in FIGS. 16-19 in the exemplary case of a photomask substrate. It will be appreciated that the invention is not restricted to the exemplary embodiments discussed in the following, which are given for illustrative purpose and merely present suitable implementations of the invention.

Lithographic Apparatus

Figure 1:
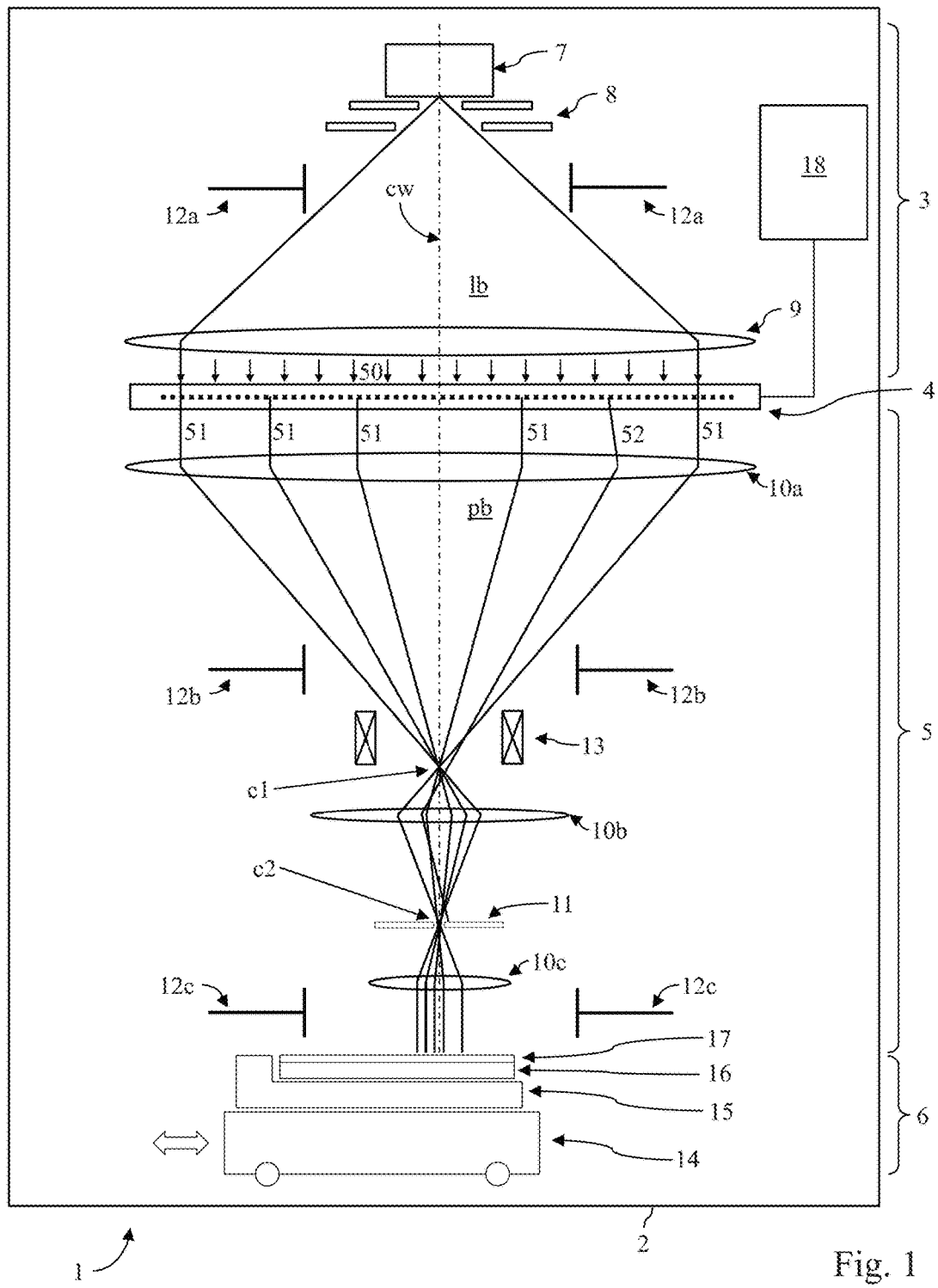
FIG. 1 a MBW system of state of the art in a longitudinal sectional view.

An overview of a lithographic apparatus suitable to employ an embodiment of the invention is shown in FIG. 1. In the following, only those details are given as needed to disclose the described embodiments of the invention such that one of ordinary skill in the art can practice the various embodiments of the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb of charged particles along the optical axis cw of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a broad, substantially telecentric particle beam 50 serving as lithography beam lb. The lithography beam lb then irradiates a PD system 4 which comprises a number of plates with a plurality of openings (also referred to as apertures). The PD system 4 is held at a specific position in the path of the lithography beam lb, which thus irradiates the plurality of apertures and/or openings and is split into a number of beamlets.

Some of the apertures/openings are "switched on" or "open" so as to be transparent to the incident beam in the sense that they allow the portion of the beam that is transmitted through it, i.e. the beamlets 51, to reach the target; the other apertures/openings are "switched off" or "closed", i.e. the corresponding beamlets 52 cannot reach the target, and thus effectively these apertures/openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to the pattern to be exposed on the substrate 16 covered with charged-particle sensitive resist 17. It has to be noted that the "switching on/off" of the apertures/openings is usually realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam pb is then projected by means of an electro-magneto-optical projection system 5 onto the substrate 16 where the beam forms an image of the "switched-on" apertures and/or openings. The projection system 5 implements a demagnification of, for instance, 200:1 with two crossovers c1 and c2. The substrate 16 is, for instance, a 6" mask blank or a silicon wafer covered with a particle sensitive resist layer 17. The substrate is held by a chuck 15 and positioned by a substrate stage 14 of the target station 6.

The information regarding the pattern to be exposed is supplied to the PD system 4 by the data path realized by means of an electronic pattern information processing system 18. The data path is explained further below in section "Datapath".

In the embodiment shown in FIG. 1, the projection system 5 is composed of a number of consecutive electro-magneto-optical projector stages 10a, 10b, 10c, which preferably include electrostatic and/or magnetic lenses, and possibly other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. 200:1 reduction. A demagnification of this order is in particular suitable with a lithography setup, in order to alleviate problems of miniaturization in the PD device.

In the whole projection system 5, provisions are made to extensively compensate the lenses and or deflection means with respect to chromatic and geometric aberrations. As a means to shift the image laterally as a whole, i.e. along a direction perpendicular to the optical axis cw, deflection means 12a, 12b and 12c are provided in the condenser 3 and projection system 5. The deflection means may be realized as, for instance, a multipole electrode system which is either positioned near the source extraction system 12a or one of the crossovers, as shown in FIG. 1 with the deflection means 12b, or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charge-particle optics alignment system. These deflection means 10a, 10b, 10c are not to be confused with the deflection array means of the PD system 4 in conjunction with the stopping plate 11, as the latter are used to switch selected beamlets of the patterned beam pd "on" or "off", whereas the former only deal with the particle beam as a whole. There is also the possibility to rotate the ensemble of programmable beams using a solenoid 13 providing an axial magnetic field.

Figure 2:
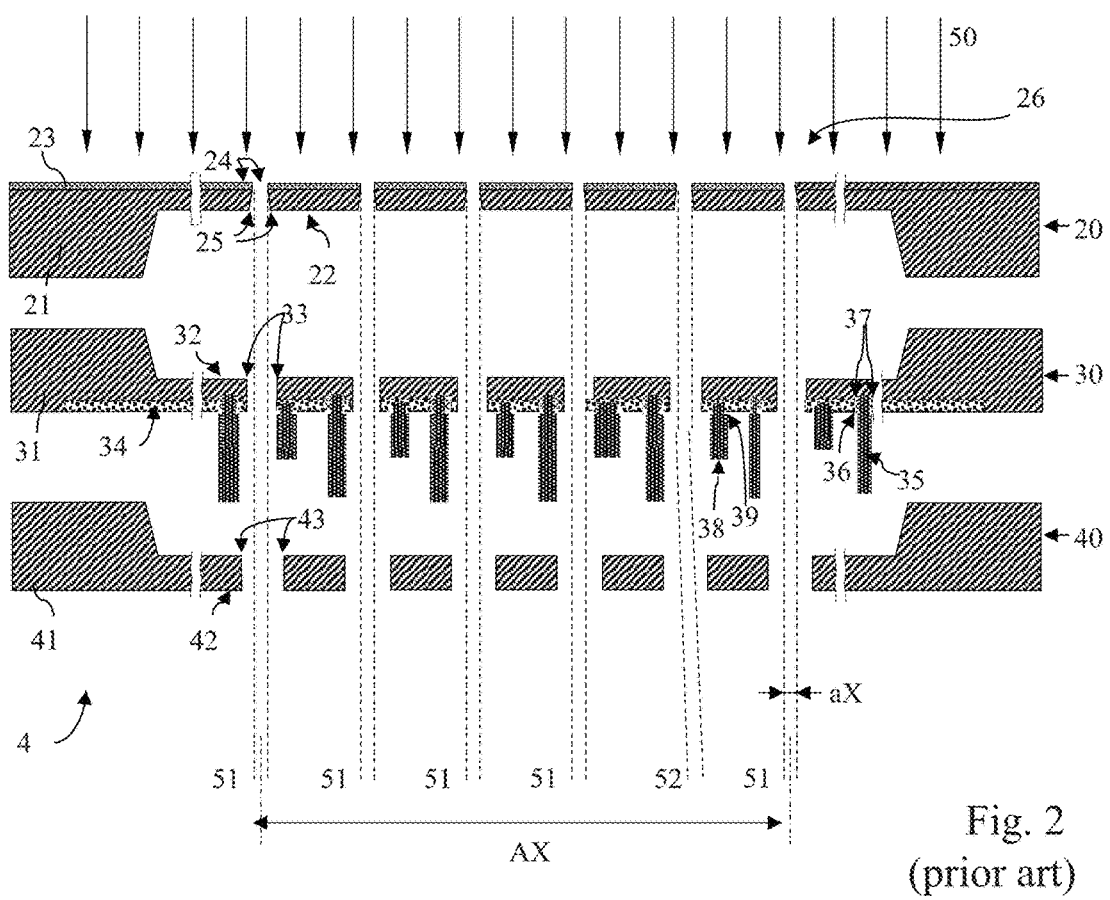
FIG. 2 a pattern definition system state of the art in a longitudinal section.

The sectional detail of FIG. 2 illustrates one suitable embodiment of a PD system 4, which comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction (vertical axis in FIG. 2).

The flat upper surface of AAP 20 forms a defined potential interface to the charged-particle condenser optics/illumination system 3. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (line in U.S. Pat. No. 6,858,118). When using electrons or heavy ions (e.g. argon or xenon), the layer 23 may also be of silicon provided by the surface section of 21 and 22, respectively, so that there is no interface between layer 23 and the bulk parts 21, 22.

The AAP 20 is provided with a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array (cf. FIG. 4). In the embodiment shown, the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual beamlets passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to 24 (by approx. 2 µm at each side for instance). CMOS electronics 34 is provided to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 in order to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding beamlet, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beamlets.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, e.g. with embedded ground and deflection electrodes, can be devised by the skilled person (see other patents in the name of the applicant, such as U.S. Pat. No. 8,198,601 B2).

The third plate 40 serving as FAP has a flat surface facing to the first lens part of the down-stream demagnifying charged-particle projection optics 5 and thus provides a defined potential interface to the first lens 10a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing through (FIG. 2). The deflected beamlet can traverse the DAP and FAP unhindered as the openings 33 and 43, respectively, are made sufficiently wide. However, the deflected beamlet 52 is filtered out at the stopping plate 11 of the sub-column (FIG. 1). Thus, only those beamlets which are unaffected by the DAP will reach the substrate.

The reduction factor of the demagnifying charged-particle optics 5 is chosen suitably in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

The ensemble of (unaffected) beamlets 51 as formed by AAP is projected to the substrate with a predefined reduction factor R of the projection charged-particle optics. Thus, at the substrate a "beam array field" (BAF) is projected having widths $BX=AX/R$ and $BY=AY/R$, respectively, where AX and AY denote the sizes of the aperture array field along the X and Y directions, respectively. The nominal width of a beamlet at the substrate (i.e. aperture image) is given by $bX=aX/R$ and $bY=aY/R$, respectively, where aX and aY denote the sizes of the beamlet 51 as measured along the X and Y directions, respectively, at the level of the DAP 30. Thus, the size of a single aperture image formed on the target is $bX \times bY$.

It is worthwhile to note that the individual beamlets 51, 52 depicted in FIG. 2 represent a much larger number of beamlets, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beamlets. The applicant has realized such columns with a BAF of approx. 82 μm×82 μm at the substrate. These examples are stated for illustrative purpose, but are not to be construed as limiting examples.

Figure 3:
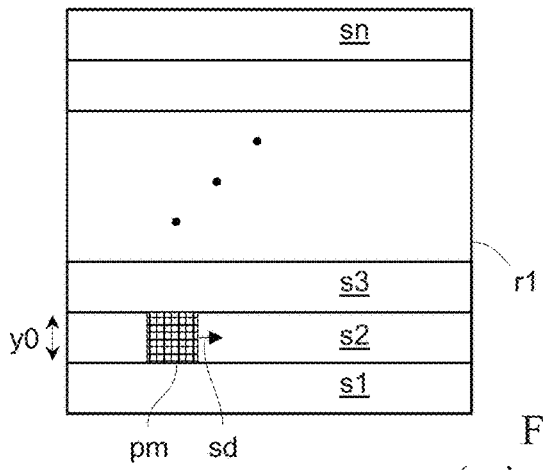
FIG. 3 illustrates the basic writing strategy on the target using stripes.

Referring to FIG. 3, a pattern image pm as defined by the PD system 4 is produced on the target 16. The target surface covered with the charged-particle sensitive resist layer 17 will comprise one or more areas r1 to be exposed. Generally, the pattern image pm exposed on the target has a finite size y0 which is usually well smaller than the width of the area r1 which is to be patterned. Therefore, a scanning stripe exposure strategy is utilized, where the target is moved under the incident beam, so as to change the position of the beam on the target perpetually: the beam is effectively scanned over the target surface. It is emphasized that for the purpose of the described embodiments of the invention only the relative motion of the pattern image pm on the target is relevant. By virtue of the relative movement the pattern image pm is moved over the area r1 so as to form a sequence of stripes s1, s2, s3, . . . sn (exposure stripes). of width y0. The complete set of stripes covers the total area of the substrate surface. The scanning direction sd may be uniform or may alternate from one stripe to the next.

Figure 5A:
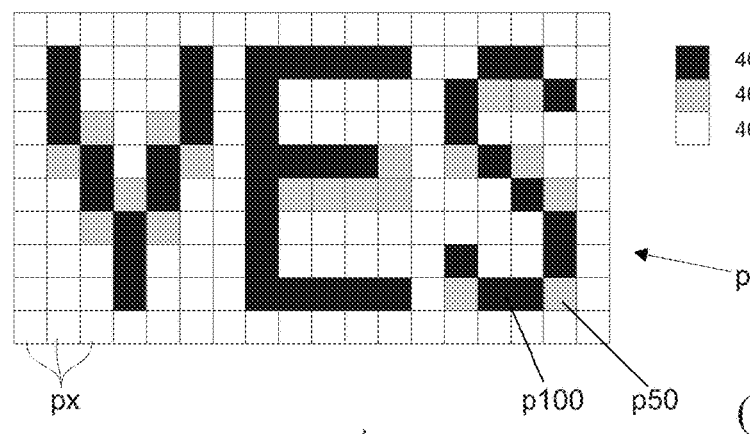
FIGS. 5A and 5B show an example of a pixel map of an exemplary pattern to be exposed.
Figure 5B:
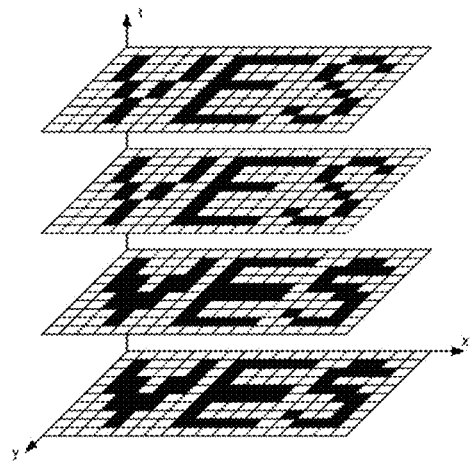

FIG. 5A shows a simple example of an imaged pattern ps with a size of 10×16=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). FIG. 5B illustrates how a 50% level is realized: each pixel is exposed several times, and for a pixel with a gray level between 0 and 100%, the gray level is realized by choosing a corresponding number of the exposures with the pixel activated; the gray level is the fraction of activated exposures over the total number of exposures. In this example, a 50% level is realized by choosing 2 out of 4. Of course, in a realistic embodiment of the invention, the number of pixels of the standard image would be much higher. However, in FIGS. 5A+B the number of pixels is only 180 for the better clarity. Also, in general, much more gray levels will be used within the scale from 0% to 100%.

Thus, the pattern image pm (FIG. 3) is composed of a plurality of pattern pixels px, which are exposed with dose values according to the desired pattern to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between a the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1)$ . . . , $i/(n_y-1)$, . . . , 1 with $n_y$ being the number of gray values and i an integer ("gray index", $0 \leq i \leq n_y$). Generally, however, the gray values need not be equidistant and form a non-decreasing sequence between 0 and 1.

Figure 4:
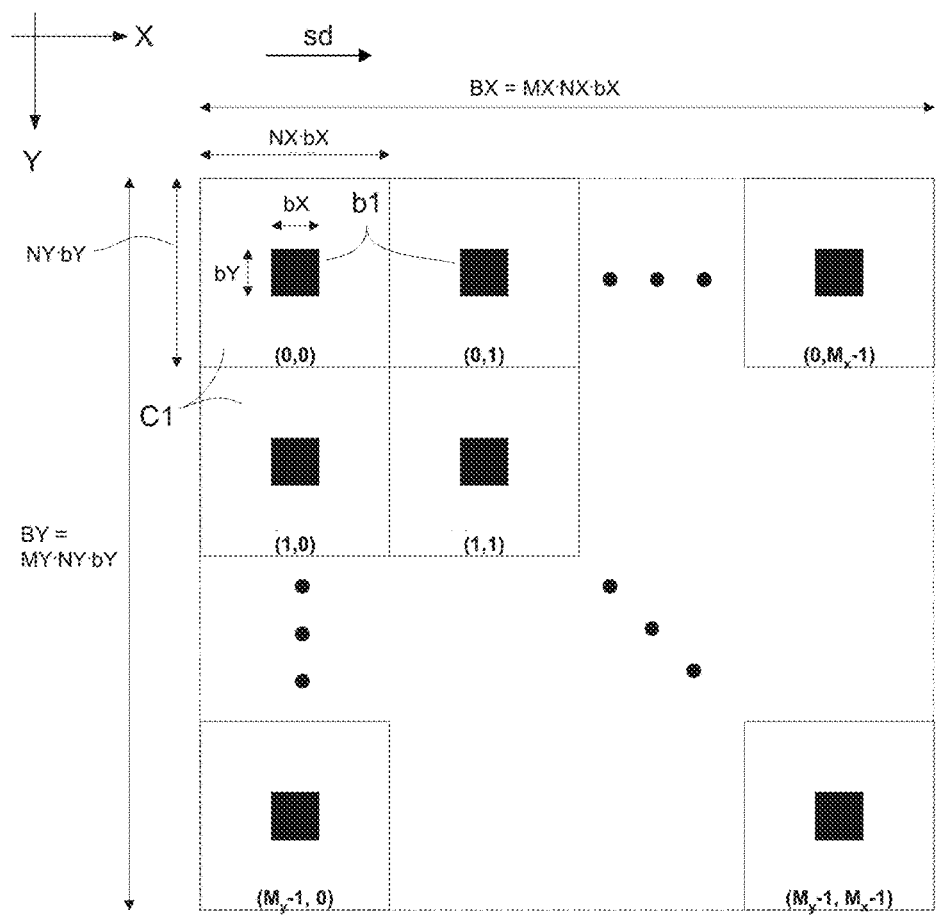
FIG. 4 shows an exemplary arrangement of apertures as imaged onto the target.

FIG. 4 shows the arrangement of apertures in the aperture field of the PD device, according to a basic layout and also illustrates several quantities and abbreviations used in the following. Shown is the arrangement of the aperture images b1 as projected onto the target, shown in dark shades. The main axes X and Y correspond to the direction of advance of the target motion (scanning direction sd) and the perpendicular direction, respectively. Each aperture image has widths bX and bY along the directions X and Y respectively. The apertures are arranged along lines and rows having MX and MY apertures, respectively, with the offset between neighboring apertures in a line and row being NX and NY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

Figure 6A:
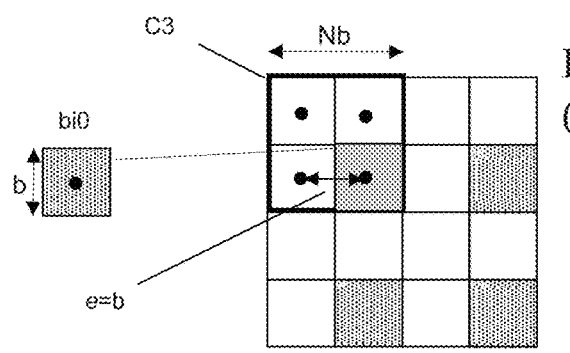
FIG. 6A illustrates an arrangement of apertures with M=2, N=2.

The distance between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of) one pixel. In another interesting case, illustrated in FIG. 6B (and in line with the teachings of U.S. Pat. No. 8,222,621 and U.S. Pat. No. 7,276,714), e may be a fraction b/o of the width b of the aperture image, with o>1 being preferably (but not necessarily) an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

Figure 6B:
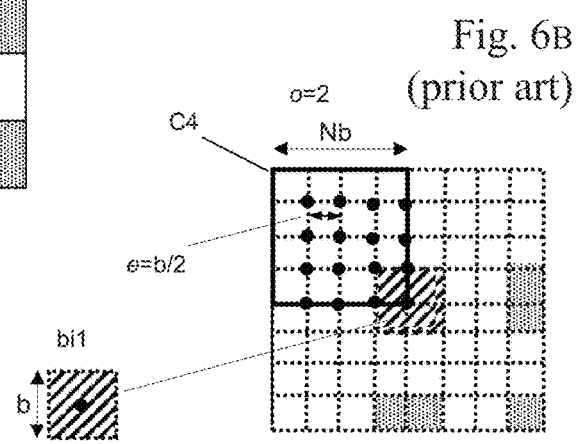
FIG. 6B shows an example of oversampling of the pixels in a "double grid" arrangement.

FIG. 6B illustrates one example of an oversampling of o=2 combined with placement grids, namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing suitable gray value for the aperture image that cover the respective pixel. As a result, an area of size a is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2=4$ pixels in the case of oversampling with o=2 in FIG. 6B (also called "double grid"). Of course, o may take any other integer value as well, in particular 4 ("quad grid", not shown) or 8, or also a non-integer value greater one, such as $2^{1/2}=1.414$.

It is worthwhile to note that with interlocking grids (o>1) it is possible to increase the number of gray shades by "dithering" while the dose distribution remains homogeneous. The basis for this is that the grey shades on any nominal grid are equal. This means that for the double interlocking grid the number of effective dose levels that can be realized is four times higher than for the non-interlocking grid. Generally speaking any oversampled exposure grid (i.e., o>1) consists of up to $o^2$ nominal grids shifted by distances b/o in X and Y direction. Thus, the step from one dose level to the next can be divided into o sub-steps where the dose level of only one of these o grids is increased; this can be repeated for the other grids until all sub-grids expose the nominal level. As the skilled person will appreciate, the beam shape at the substrate is the convolution of the machine blur and the reduced aperture shape of the aperture plate. It is possible to obtain a homogeneous dose distribution on the substrate by setting the width b to a natural multiple of the exposure grid constant e; in other words, making o=b/e an integer. Otherwise the dose distribution may have minima and maxima with a periodicity the exposure grid, by virtue of aliasing effects. A high number of gray shades allows better feature placement. Therefore increasing the gray levels is of relevance where the gray shades per pixel position are limited to a certain number.

Figure 7A:
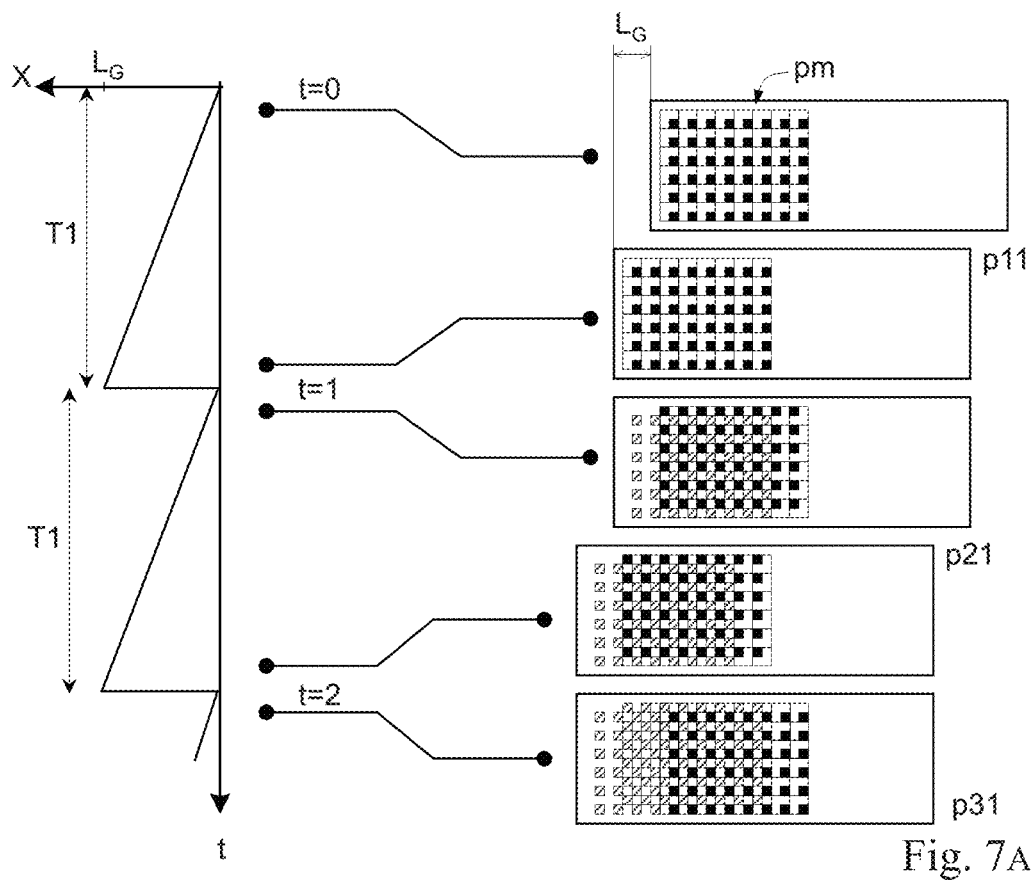
FIG. 7A illustrates the exposure of one stripe.

FIG. 7A shows an exposure scheme of the pixels, which is suitable for many embodiments of the invention. Shown is a sequence of frames, with increasing time from top (earlier) to bottom (later). The parameter values in this figure are o=1, N=2; also, a rectangular beam array is assumed with MX=8 and MY=6. The target moves continuously to the left, whereas the beam deflection is controlled with a seesaw function as shown on the left side of the figure. During each time interval of length T1, the beam image stays fixed on a position on the target (corresponding to a position of a "placement grid"). Thus, the beam image is shown to go through a placement grid sequence p11, p21, p31. One cycle of placement grids is exposed within a time interval L/v=NMb/v, by virtue of the target motion v. The time T1 for exposure at each placement grid corresponds to a length $L_G = vT1 = L/(No)^2 = bM/No^2$, which we call "exposure length".

The beamlets are moved over the distance of $L_G$ during the exposure of one set of image elements together with the target. In other words, all beamlets maintain a fixed position with regard to the surface of the substrate during the time interval T1. After moving the beamlets with the target along distance $L_G$, the beamlets are relocated instantaneously (within a very short time) to start the exposure of the image elements of the next placement grid. After a full cycle through the positions p11 . . . p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

It is remarked that FIG. 7A neglects the time needed for opening/closing the individual apertures according to the actual pattern. In reality the deflecting devices of the DAP and deflection multipole systems need a certain settling time interval $T_S$, to settle the status of the apertures after repositioning and fading out of transient oscillations. The settling time interval $T_S$ is a (very) small fraction of the pixel exposure cycle T1. Therefore, rather than the entire pixel exposure cycle T1, only a usable time Tu=T1−$T_S$ is used for the exposure of pixels. The time interval Tu is the pixel exposure period within which to ensure that the appropriate dose is passed to the respective pixels. In the following, however, it is assumed that $T_S$ is negligible as compared to T1, and no discrimination is made between Tu and T1 hereinafter.

The usable exposure time Tu is divided into g time slots, corresponding to the number of gray shades possible to address. One value for g would be g=16 (4 bit). The pixel exposure is activated according to the desired gray shade, which is the sum of used time slots within Tu. If the dose applied to one pixel within the time Tu is digitized into g gray levels, it is possible to reload a general blanking cell g times during Tu; each blanking cell in the blanking array receives its individual gray shade during the exposure period T1 (or more accurately, the usable time Tu).

Figure 7B:
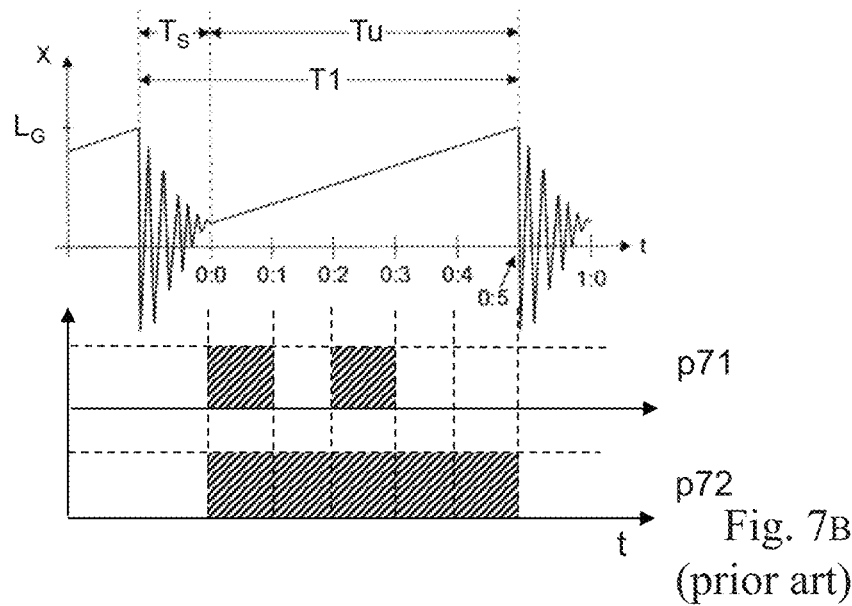
FIG. 7B illustrates the exposure of gray levels.

FIG. 7B illustrates the exposure of two pixels with different gray shades in a simplified example with g=5; the relative size of the settling time interval $T_S$ is greatly exaggerated. In accordance with g=5 there are five time slots in each usable time interval Tu. A first pixel p71 is exposed at a gray shade at 100% (i.e., "black"), and a second pixel p72 at a gray shade of 60%. For pixel p72 two time slots of a corresponding blanking electrode generate a gray shaded pixel; in this example, since 60% corresponds to a gray shade with 2 out of 5, and two of them—in arbitrary order—are set to switched-on. On the other hand, for pixel p71 the respective blanking electrode is activated during all five time slots, thus generating a black pixel with the maximum dose that may be deposited during Tu.

Figure 8A:
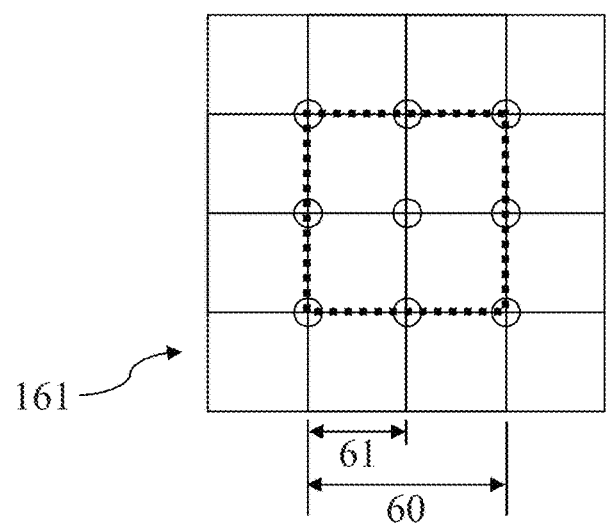
FIGS. 8A-8C show three different cases of grid placements, namely
Figure 8B:
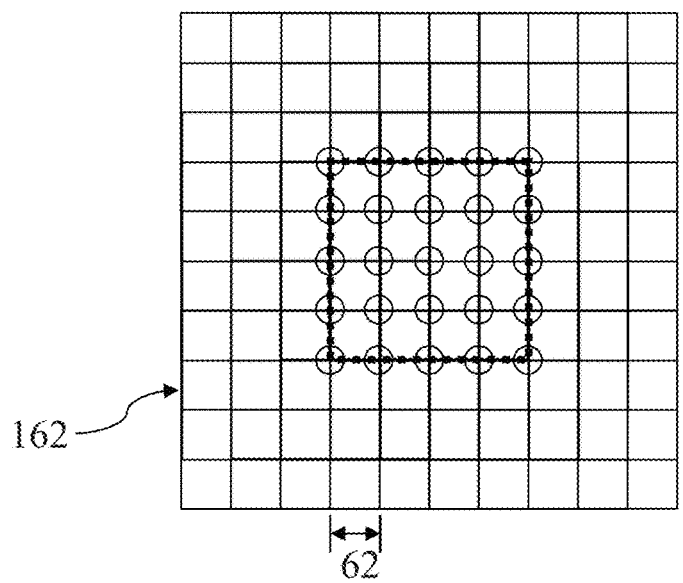
Figure 8C:
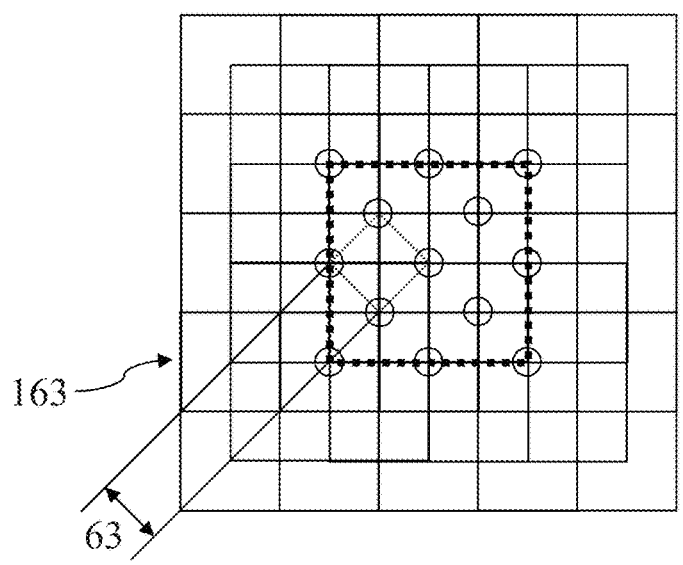

Referring to FIGS. 8A-8C, each exposure spot 60 corresponding to an aperture image bi0, bi1 (FIG. 6A,B) is exposed with discrete dose levels as will be discussed in more detail below. FIGS. 8A-C illustrate various overlap configurations of special interest.

FIG. 8A depicts the "Double Grid" multi-beam exposure as discussed above with FIG. 6B, where in this arrangement 161 the overlap between the exposure spots is half of the beam spot size in X as well as in Y direction as shown in FIG. 8A. In this case the physical grid size 61 is half of the linear size of the spots 60.

In contrast, a simple non-oversampled grid, such as the one illustrated in FIG. 6A, is called "Single Grid".

In the "Quad Grid" multi-beam exposure illustrated in the arrangement 162 of FIG. 8B, the overlap between the spots is ¾ of the beam spot size in X as well as in Y direction. In this case the physical grid size 62 is a quarter of the spot size width. The number of grid points to be addressed is four times the number in the "Double Grid" illustrated in FIG. 8A.

FIG. 8C depicts another grid layout 163, where in addition to Double Grid overlapping beam exposures, beam exposures are done in the centers in between. Therefore, the physical grid size 63 is $½^{3/2}$ (i.e., √2/4) of the linear spot size. This multi-beam exposure mode is called "Double-Centered Grid". The number of grid points to be addressed is two times the number in the "Double Grid" illustrated in FIG. 8A.

Figure 19:
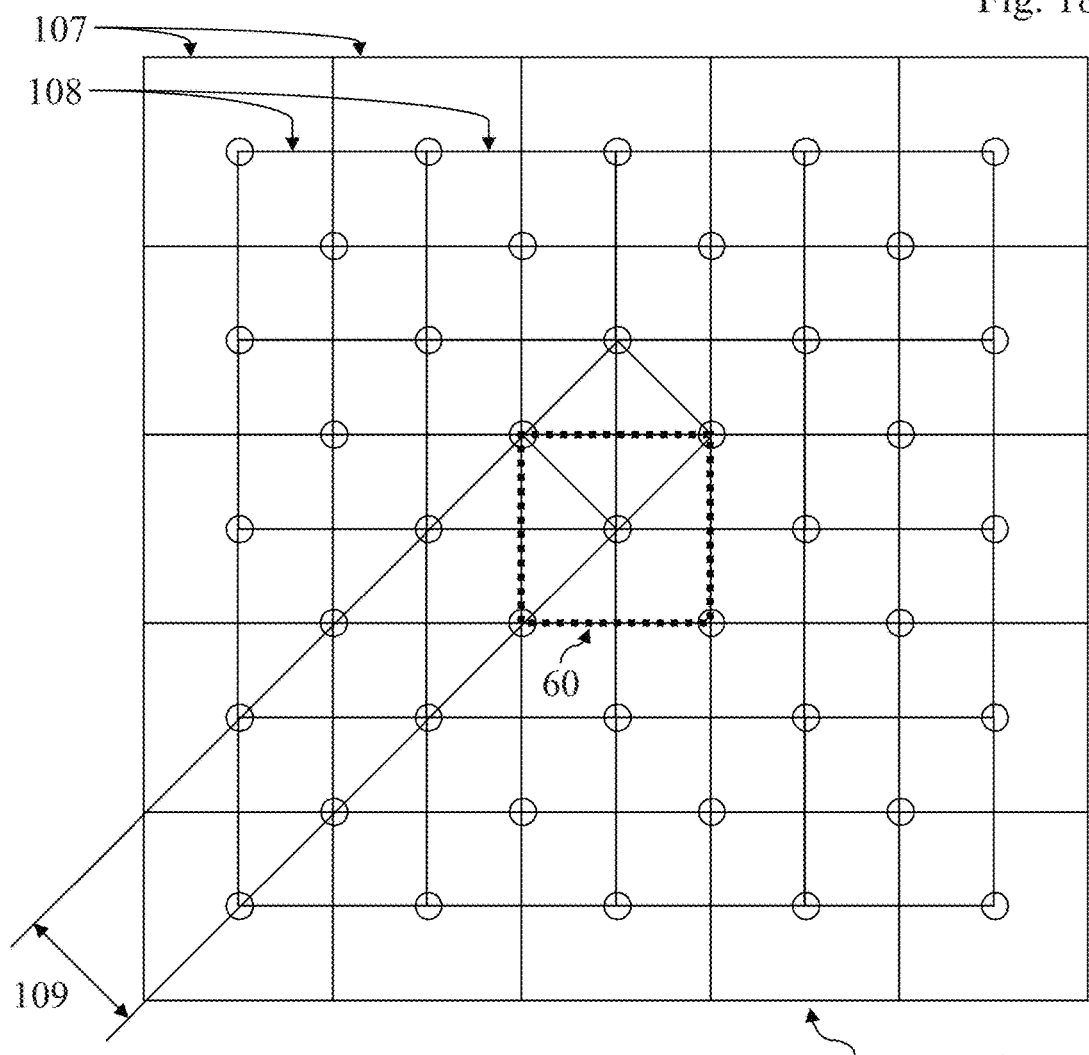
FIG. 19 shows a "Single-Centered Grid" which may be used for writing non-critical pattern areas.

In an analogous way, also the Single Grid can be extended to a "Single-Centered Grid" with physical grid size of $½^{1/2}$ of the linear spot size; see FIG. 19. The number of grid points to be addressed in the Single-Centered Grid is two times the number in a Single Grid, or half of the number in the "Double Grid" illustrated in FIG. 8A.

FIG. 9 illustrates the exposure of one exposure spot with a maximum dose level. In the exemplary case of a 4 bit coding, there are 16 dose levels (0, 1, 2, . . . 15), i.e. the maximum dose level is the sum of 15 dose level increments 64.

Figure 13:
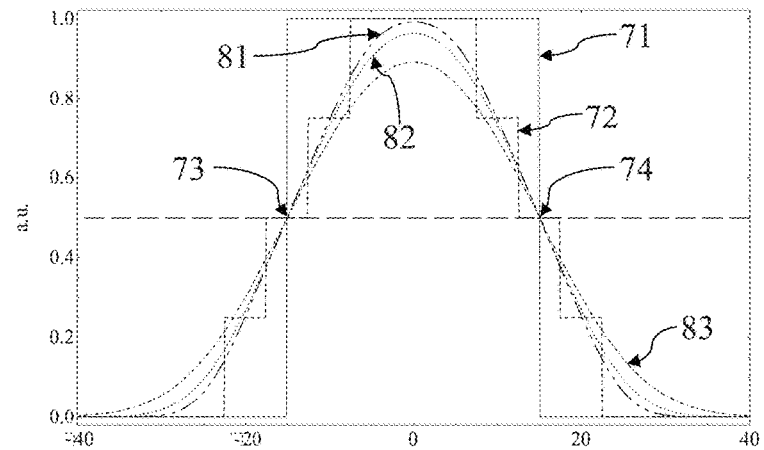
FIG. 13 illustrates the generation of a 30 nm line with the MBW.

FIG. 10 shows the ideal intensity profile 71 for a line of a width 30 nm, in the idealized case of zero blur. When using "Quad Grid" multi-beam exposure the overlap is a quarter of the beam size. Thus, for the case of 20 nm beam size the physical grid size is 5 nm. A discrete dose level can be assigned to each area of the physical grid, which is 5 nm×5 nm for the example chosen; the line 72 in FIG. 10 indicates the superposition of the intensity (or total dose) as it is composed by the overlapping exposure spots with discrete dose levels assigned to the pixel positions for generating the 30 nm line, whereas for better visibility the blur has been set to zero (so that the dose distribution of a single exposure spot becomes a rectangle). If the blur has a realistic value such as shown in FIG. 13, the step function at the edge of the rectangle is convoluted with a Gaussian function, which eventually transforms to a Gaussian shape. In that sense the line 72 can be seen as superposition of Gaussian functions at blur zero. In the general case the dose level histogram will not be symmetrical in order to position the left and right edge at pre-defined positions.

FIG. 11 shows a simulation for a line of 30.0 nm width, with the left edge to be positioned at 0.0 nm and the right edge at 30.0 nm. For the simulation, it was assumed that beam spots of 20 nm are exposed with 5.1 nm 1sigma blur (i.e., 12.0 nm FWHM blur). The intensity profile 76 is formed by overlapping the profiles of the exposure spots 73, 74, and 75. The dose level of the leftmost exposure spot 74 is adjusted such that the 30 nm line starts at the desired start position 77, i.e. at 0 nm. The dose level of the rightmost exposure spot 75 is adjusted such that exposed line ends at position 78 at 30.0 nm. As can be seen in FIG. 11, in accordance with "Quad Grid" exposure, the overlap of the exposure spots 73, 74, 75 is a quarter of the beam size, i.e. 5 nm.

FIGS. 12A and 12B illustrate how the MBW device writes lines with precise edge definitions; in each figure, the top frame shows the edge position error vs. line width, the middle frame the intensity profile, and the bottom frame shows the edge position deviation when enhancing the exposure dose by 10% vs. line width. FIG. 12A shows the intensity profile obtained for a 31.4 nm line width, and FIG. 12B for a 40.0 nm line width. Using the MBW with 20 nm beam size and Quad Grid exposure (5 nm physical grid size), the line width of the structure generated by the exposure can be changed in steps of 0.1 nm. Because of the integer dose levels there are slight deviations from the 0.1 nm address grid. These deviations are indicated as "edge position error" (top frames), as functions of the desired line width, in 0.1 nm steps between 30.0 nm and 40.0 nm. As can be seen the deviations are within 0.05 nm. Furthermore, the change of edge position with 10% change of dose is only approx. 1 nm, varying only slightly with change of line width as shown in the bottom frames. In other words, since the dose is controlled in a MBW to better than 1%, the change of edge position with 1% change of dose is within approx. one atomic layer.

Figure 13A:
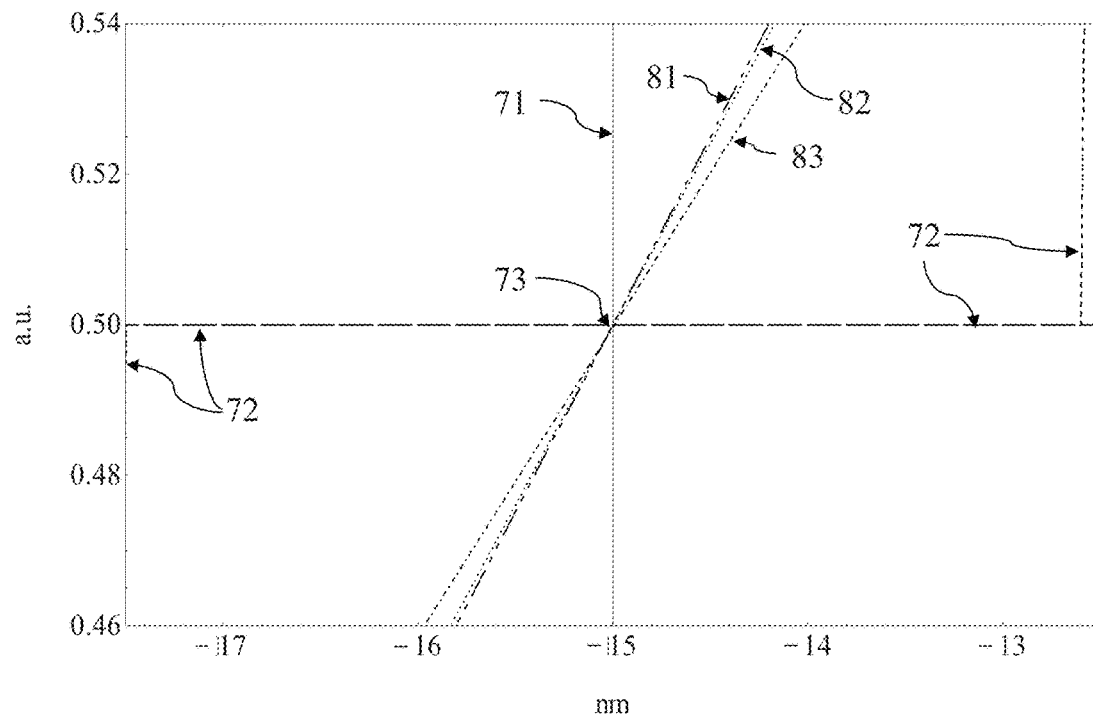
FIG. 13A shows a detail of FIG. 13 at the left-hand flank where the intensity profiles crosses the 50% (0.5 a.u.) intensity level.

FIG. 13 illustrates a most important advantage of the MBW, namely, that the line width is virtually independent of the beamlet-blur at the 50% dose threshold. Shown in FIG. 13 are the intensity profile 71 for zero blur, the dose level histogram 72, and resulting intensity profiles 81, 82, 83 calculated with 3.5 nm, 5.0 nm, and 7.5 nm 1sigma blur, respectively. The edge positions 73 and 74 of the generated structure are where the zero blur intensity profile 71 crosses the 50% (0.5 a.u.) intensity level. The enlarged detail of FIG. 13A shows the region around the position 73 at the left-side flank. The dose level assignments 72 are for using 20 nm beam size with 1sigma blur of 5 nm and Quad Grid multi-beam exposure, providing a 5 nm physical grid size.

FIGS. 14A, 14B, and 14C show intensity profile diagrams illustrating how the multi-beam exposure methods illustrated here can achieve a fine positioning of structure feature with resolution smaller than the grid size. In the intensity profile diagrams, like those of FIGS. 14A-C, the discrete dose levels are visualized as rectangles 64 of uniform height, piled up in a "brick-layer" arrangement; of course, this "brick-layer" depiction is only symbolical and intended to facilitate interpretation of the drawings.

FIG. 14A shows a dose level histogram, for the example of a line of 30 nm width exposed by means of a 4 bit (i.e., 15 dose levels per spot) exposure in a Quad Grid with a beam spot size of 20 nm width. The grid size 62 is ¼ of the linear size of the exposure spots, which are symbolized as rectangles piled up in a "brick-layer" arrangement, and the resulting dose level distribution 65 is outlined as a bold line.

The line width can be made smaller or larger in very fine steps, which are smaller than the grid size, in this case the Quad Grid size 62. Reducing the line width can be achieved by lowering the dose level of the outermost exposure spots and/or omitting exposure spots (the latter when the reduction is at least about one half of a exposure spot size). Increasing the line width can be achieved by enhancing the dose level of the outermost exposure spots and/or, in particular when the maximum dose level has been reached, to add an additional, preferably overlapping, exposure spot. The latter aspect is illustrated in FIG. 14B: an exposure spot 66 having a defined dose level is added, resulting in a dose level histogram 67 for the line with larger width compared to 65. By combining these effects of decreasing and increasing on either side, there is also the possibility to shift the line position in very fine steps. FIG. 14B illustrates a shift of the line without changing the width, which is achieved by removing dose levels from spot 68 and adding dose levels from spot 69, resulting in the dose level histogram 70 which corresponds to a line shifted to the right as compared to the line of FIG. 14A.

The intensity profiles of FIGS. 14A-C are shown along the X direction of the target plane. It is straightforward to extend the multi-beam exposure methods illustrated here to lines along other directions as well, and fine positioning can be achieved for lines at any angle to the on the target plane.

Figure 15A:
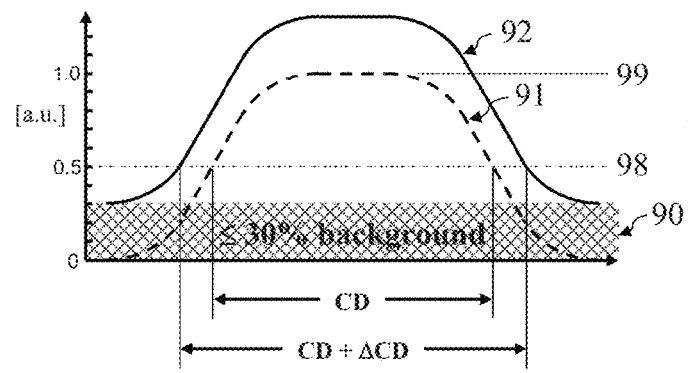
FIG. 15A illustrates the introduction of a background due to indirect exposure effects, for the example of a line feature.

The exposure of a certain location on the target by means of the charged-particle radiation impinging on that area can, depending on the species and energy of the charged-particle radiation employed, cause an indirect exposure of an area in vicinity of the location exposed. In particular when using high-energy (e.g. 50 keV) electrons for pattern exposure, there is a backscattering of electrons from the substrate, and these electrons cause an exposure of the charged-particle sensitive layer 17 in vicinity to the location of impact of the (primary) electron beam. This effect is well-known to the skilled person as the so-called proximity effect. In the case of 50 keV electrons the area affected by the backscattered electrons has a radius of range of approx. 10 µm. When exposing a dense pattern with a pattern density of 50%, the dose introduced by the backscattered electrons can become as high as about 30% of the plateau level of the exposure intensity as illustrated in FIG. 15A. The level of the background depends on various factors such as the radiation particle energy and material on the target, but for the following it is assumed that the background is 30%. The 100% dose level, denoted by reference symbol 99, corresponds to the full exposure dose at the location of a maximum of a line pattern exposure in the case of no background as depicted by the strong dashed curve 91 in FIG. 15A; this 100% level corresponds to 1 a.u. of the dose density in FIGS. 15A-E. The dose level necessary to induce development of a high-contrast charged-particle sensitive layer 17 is referred to as "dose-to-size level" or "contour level", which in the drawings is represented by a dash-dotted horizontal line 98. In a typical implementation the 100% level is chosen such that the contour level is at 0.5 a.u. (50%). This choice is usually suitable since the slope of exposure intensity is highest at a 50% level (disregarding background); the actual value of the contour level in terms of the 100% level may vary as suitable with an individual pattern to be exposed. If no background were present, the contour level could be met at the desired positions of the line pattern 91 for a certain desired critical dimension (CD). The cross-hatched area 90 illustrates the effect of backscattered electrons, causing an indirect exposure level at about 0.3 a.u. as mentioned earlier, which will result in exposing a pattern 92 with a dose equal to the "primary" pattern 91 on top of the background. As a consequence, there is a resulting error CD+ΔCD.

Figure 15B:
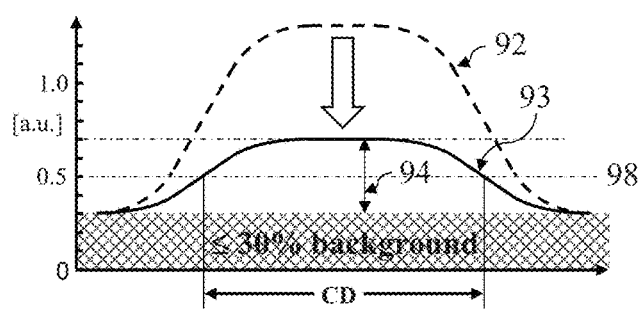
FIG. 15B depicts a compensation for the background by scaling down exposure doses.
Figure 15C:
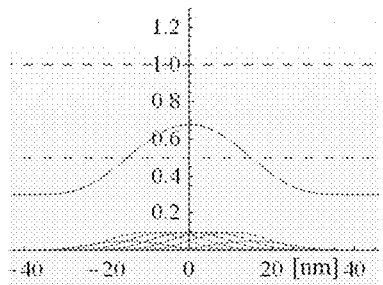
FIG. 15C shows an intensity profile for a 30 nm line corresponding to FIG. 15B.

FIG. 15B illustrates a first approach to correct this error, namely, by scaling down the pattern exposure dose by a suitable factor. In FIG. 15B, the pattern profile is reduced from the original profile 92 to a re-scaled profile 93. In the example shown in FIG. 15B of a 30% background dose, an exposure dose 94 of only 0.4 a.u. (40%) is sufficient. The drawback of this type of dose correction of the proximity effect is a substantial lower dose latitude (higher "dose margin error") due to the more shallow slope of the intensity profile. Simulations for a 30 nm line (Quad Grid exposure with 20 nm beam size, assuming 5 nm 1sigma blur), as shown in FIG. 15C, indicate that the result is 2.7 nm for the value of ΔEdge per 10% Dose, much higher compared to the value of approx. 1.1 nm in the case of no background (FIG. 12B).

The interaction between the proximity effect and the density of a structure to be printed is discussed below in relation to FIGS. 21A+B.

Figure 15D:
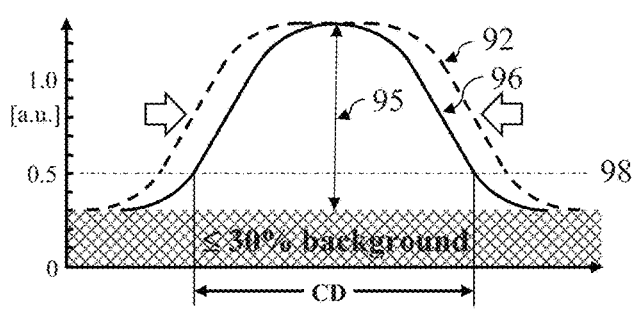
FIG. 15D depicts a compensation for the background by "size correction"
Figure 15E:
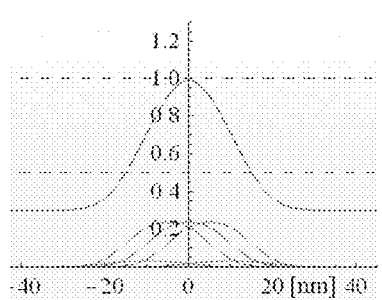
FIG. 15E shows an intensity profile for a 30 nm line corresponding to FIG. 15D.

Another approach to compensate the proximity effect, which showed to be superior, involves a "size correction", where the maximum dose level 95 is not changed, but the width of the pattern exposure 96 is narrowed by a suitable amount. In other words, the position of the boundaries of the feature exposed are moved (repositioned) by an amount corresponding to half of the error ΔCD. This is illustrated in FIG. 15D. Corresponding simulation for a 30 nm line (with same assumptions as above) result in an improved value of ΔEdge per 10% Dose of 1.4 nm (FIG. 15E). Thus, this approach allows an improved stability of the edge positioning against (inadvertent) dose variations.

Figure 16:
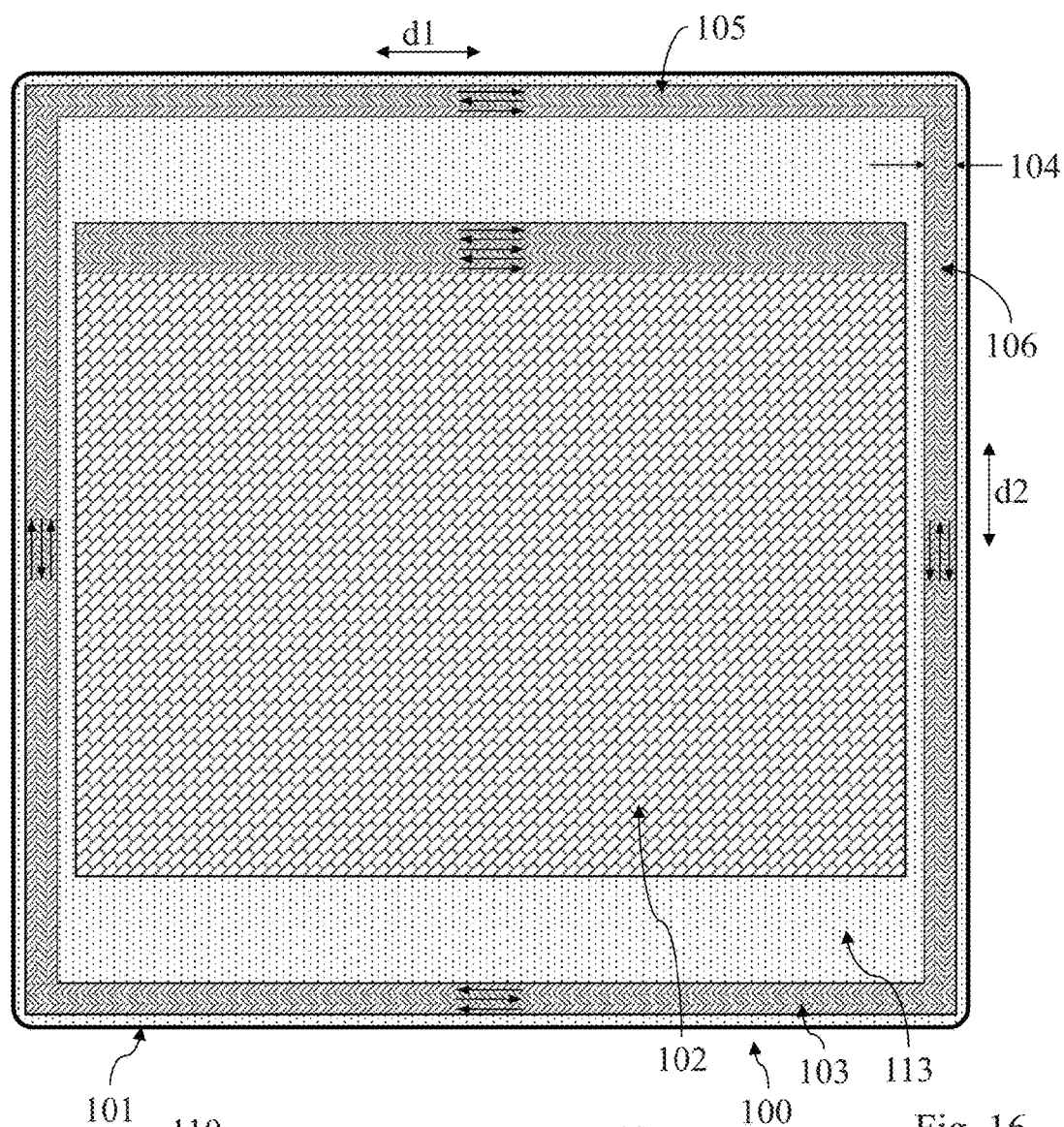
FIG. 16 depicts an example of a target field including non-critical pattern areas and illustrates writing of non-critical pattern areas using stripes written with different general directions.

As mentioned above, a typical pattern exposed on a target will, in addition to the substrate exposure area with critical patterns, include one or more areas with non-critical patterns. FIG. 16 shows an example for the case of a 6"×6" photomask substrate 100 with an outer dimension 101 of 152.4 mm×152.4 mm (corners rounded) and a primary area 102, also referred to as "critical pattern area", of 132 mm×104 mm (typical example) which contains a plurality of patterns to be written with a given CD.

The primary area 102 is surrounded by a "frame pattern" area 103, which has a side length of e.g. 148 mm and a width 104 of e.g. 5 mm. This illustrates that the frame pattern (or border) area may be as large as 15% of the critical pattern area. The frame pattern area 103 contains features of relaxed requirements to accuracy, and thus can be said to represent a secondary pattern area in the meaning of the instant application. In the example shown in FIG. 16, the area 102, corresponding to a primary pattern region, and the secondary pattern region 103 are separated by "blank" areas 113 without exposure; in other realizations (cf. FIG. 17) the two regions may also be directly adjacent. In case of using a MBW tool with a stage where multi-beam writing in stripes can be done only along one axis, the necessary writing time for the frame pattern area can be significant and, thus, detrimental.

FIG. 16 also illustrates another embodiment of the invention, wherein the writing of the frame pattern area 103 is done with exposing stripes 105, 106 oriented along two different directions d1, d2. This method is made possible by the recent MBW realization with improved vacuum stage, where high stage velocity with adequate positional performance in realized in X as well as in Y direction. In general, writing of non-critical patterns may include writing of stripes which are oriented along several general directions d1, d2. In particular, in the case that certain parts of those patterns include "slanted" line components, i.e., oriented at an angle between 0 and 90° to the X direction, the general direction of a stripe for writing such line components may be oriented at that angle as well. Such slanted lines may, for instance, occur as line segments of numbers or characters (cf. FIG. 17). Herein, the term "general direction" is meant to refer to both ways of moving along a given direction on the target plane, such as ±x or ±y, where the symbol ± denotes that both ways belong to the same general direction.

According to another embodiment of the invention, the secondary region 103 is printed with an exposure grid of coarser physical grid size, and thus having reduced grid points, which need to be addressed in the same time. For example, while writing the primary region 102 with a "Double Grid", for the secondary region 103 a grid called "Single-Centered Grid" may be implemented in order to save a factor of two in grid point addressing. FIG. 19 depicts the geometric arrangement 114 of a "Single-Centered Grid", which may be visualized by a combination of two "Single Grid" sets 107 and 108 where the second grid 108 is centered within the grid 107. The Single-Centered Grid multi-beam exposure results in a physical grid size 109 which is equal to $½^{1/2}$ (i.e., $1/\sqrt{2}$) of the linear spot size 60.

In comparison to the Double Grid multi-beam exposure method (FIG. 8A, as visualized in the detail of FIG. 17 for the substrate exposure field 103), the Centered-Single Grid multi-beam exposure method is twice as fast.

Figure 17:
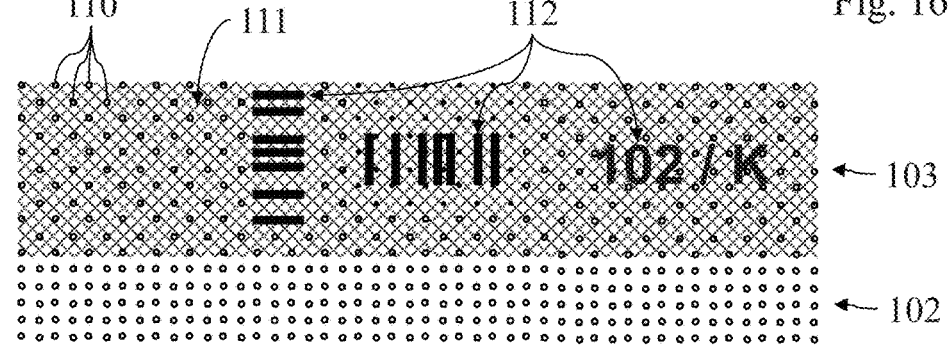
FIG. 17 illustrates a typical example of non-critical pattern features.

FIG. 17 illustrates a further embodiment of the invention. The frame pattern area 103 is exposed with the Single-Centered Grid multi-beam exposure method (FIG. 19) such that a background area 111, for instance with 0.3 a.u. dose level (30%), is obtained; this is possible by using e.g. 50 keV electrons. As a consequence it is possible to expose non-critical patterns 112 (such as bar codes, numbers, visual markers, etc.) with a much lower dose 94, which in this example is at 0.4 a.u. For these non-critical features as shown in FIG. 17, it is possible to lower the exposure dose 92 to approx. 0.3 a.u. since a smaller line width CD-ΔCD of such non-critical patterns 112 can be tolerated, which is induced with an intensity profile as illustrated in FIG. 15B.

In contrast, when using size correction 96 for the exposure of critical patterns as shown in FIG. 15D, the necessary exposure dose 95 for a maximum exposure is 1.0 a.u. (100%). Thus, this aspect allows to expose the frame pattern with a dose which is lower by a factor of at least 2.5. Introducing additional background dose in region 111 of the frame area 103 does not lower the efficiency of writing as the area 111 must be completely covered by stripe exposures anyway. Even when the pattern 112 is sparse, the stage must travel between the parts of the pattern 112. During this travel time, it is possible to deliver a background dose to the substrate in area 111 without any additional effort. This background dose adds to the proximity-effect for the pattern 112 and reduces the dose needed to reach the dose-to-size level. Thus, the idle time of the beamlets decreases and printing efficiency increases.

In addition, a more homogeneous background distribution, i.e., within the range of electron beam proximity effects, facilitates dose-based corrections because a smaller number of gray shades needs to be used for compensation of the proximity effect by the locally printed dose. The maximum dose can be steered by the exposure time per grey shade and local reduction of dose by reducing the employed gray shades is less needed. The fraction of exposure time per time interval, thus the printing efficiency, increases.

Figure 18A:
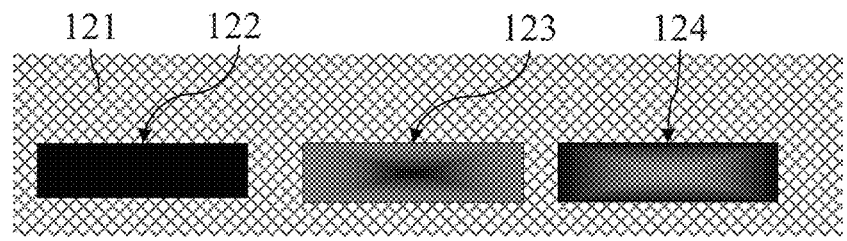
FIGS. 18A and 18B illustrate the electron beam proximity-effect and its relation to the background.
Figure 18B:
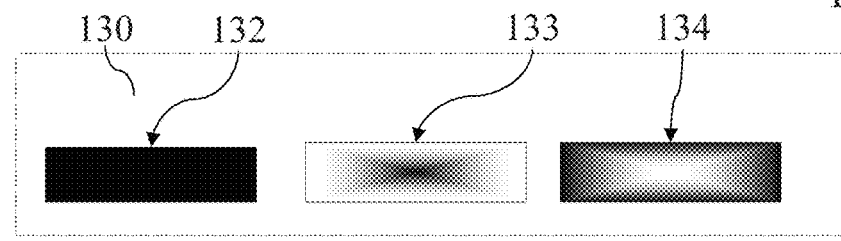

FIGS. 18A and 18B illustrate how the proximity effect interacts with the structure to be printed as well as with a background added artificially, specifically with regard to structures in the secondary pattern region 103. FIG. 18A illustrates a homogeneous "background" 121 printed on purpose, e.g. in a secondary pattern region 103 (FIG. 16) on a die field on the target with a feature 111 (FIG. 17). An exemplary desired, large structure 122 to be formed with a secondary critical dimension has a dimension comparable to or much larger than the proximity effect range of about 10 µm. Due to its own background generation, when this structure is imaged with the naive contour as illustrated by the structure 122, the resulting structure 123 will look blurred at the edges, because of a dose gradient from edges and corners into the center of the structure (illustrated by the grey shading of structure 123). This effect is, however, even more pronounced if the structure is located within an empty, un-written space 130, as shown in FIG. 18B for the structure 132, resulting in an even stronger gradient for the resulting structure 133, as compared to a situation of a surrounding with present background 121 as in FIG. 21A. In order to compensate for this interaction between a structure and its surrounding, the intensity dose profile within the structure as imaged will be modified, as shown with respective structures 124, 134 in FIGS. 18A+B. As can be seen, this so-called "proximity effect correction" implies enhancement of the dose on the edges, and/or conversely reduction of the dose in the center of the structure, so as to produce a resulting structure with actual exposure dose profile corresponding to the desired structures 122, 132.

As will be evident from the above, the proximity effect correction needs to be less pronounced when a background surrounding the structure is present.

A further aspect to compensating the influence of proximity effect is based on the fact that, in particular for the present example of a MBW device, there are two possibilities for setting the dose which the incoming electron beam will impart to the target. First, gray shades may be used according to the number of gray shades available, as explained above. Second, the exposure time per gray shade may be adapted. In many cases, the first option will be used for correction of the proximity-effect induced background dose error, because the proximity effect may change quickly for generic structures to be printed, at least on the scale of the range of 10 µm. When printing with a velocity of some mm/sec, such correction may be more easily addressed by reducing dose by employing reduced gray shades. The exposure time per gray shade, on the other hand, is kept at a fixed clock rate that synchronizes exposure dose, stage movement and steering of the beam.

Therefore, in regions with large background that are in vicinity of regions with low background, it will be suitable to leave beamlets idle during the fraction of time that corresponds to the reduction of gray shades (cf. FIG. 7B). In regions such as those with a background 121, the idle time of the exposure slots of beamlets may be reduced. The dose needed for printing is adapted in consideration of an appropriate choice of the usable exposure time Tu.

Typically, the data used for printing on the target are rasterized bitmap data which are determined online during the write process directly from polygonal vector data. For efficient implementation enabling a real-time treatment, rasterization algorithms are implemented on highly-parallelizable GPU computers, and the algorithm returns a continuous stream of bitmap data for the desired, chosen grid. It is, therefore, highly desirable that the rasterized bitmap data ('pixels') to be printed in non-critical pattern areas be determined online in the same manner as those in critical pattern areas (primary region 102), without changing the principal rasterization algorithm for the grid ('accurate grid').

Assuming bitmap data (pixels) have been determined for an accurate grid such as the Double Grid (FIGS. 8A and 20), the pixel data includes pixels values having gray shades at the positions of the pixels in the accurate grid. Those values are then mapped to the pixel positions of the coarser grid to be finally used in the secondary region 103. This algorithm, also dubbed "Grid Reducer", is an algorithm that is applied to the bitmap data optionally after the rasterization algorithm but before two-dimensional gray shade dithering. In general, a grid or pixel reduction factor, Nred, is applied which is the ratio of the number of pixel positions in the accurate grid to the number of pixel positions in the final grid (taken for some representative area, such as the area shown in FIG. 20A). Preferably, the final grid in the secondary region corresponds to a subset of the accurate grid, so the grid reduction factor Nred is an integer number; in typical embodiments, such as shown here, Nred is a power of two.

Figure 20:
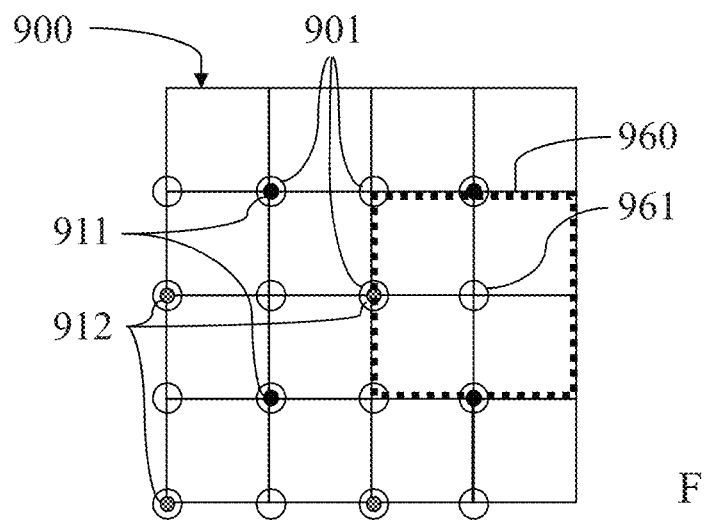
FIG. 20 contrasts a Double-Grid with a Single-Centered Grid.
Figure 21:
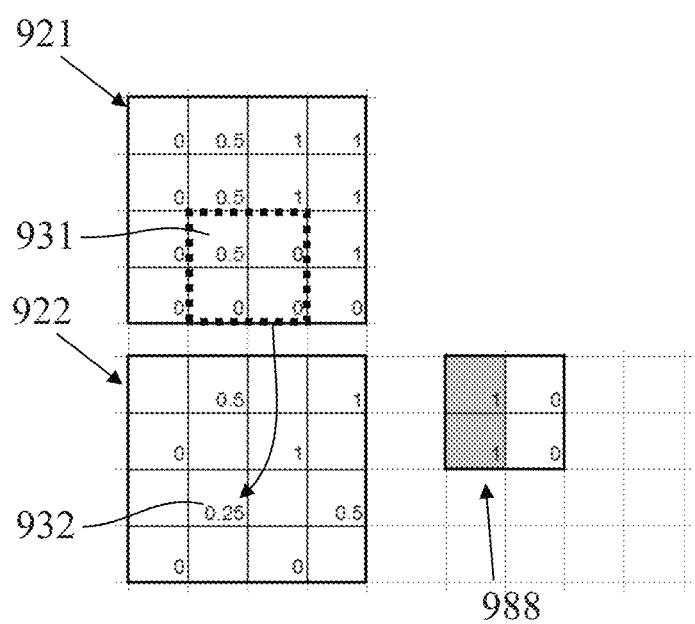
FIG. 21 illustrates a method to systematically reduce rasterized pixel data in regions of non-critical patterns, for the example of the Double Interlock and Single-Centered Grids of FIG. 20.

FIGS. 20 and 21 illustrate an example of the Grid Reducer method according to this aspect of the invention. The non-restrictive example relates to the reduction of pixel data from a Double Grid to a Single-Centered Grid.

FIG. 20 illustrates an overlay of the Double Grid and a Single-Centered Grid, which correspond to the accurate grid and the final grid, respectively, of this example. In an exemplary sample region 900 of size 4×4, the number of grid points 901 addressable in the accurate grid, i.e. Double Grid, is Ngrid1=16 (wherein, to avoid overcounting pixel positions, the pixel positions at the lower and left-hand side are counted full while pixel positions at the upper and right-hand border are discounted). These sixteen pixel positions 901 of the Double Grid are highlighted by open circles in FIG. 20. It is reminded that each position is representative for an area of the size of one aperture image, as illustrated for one exemplary pixel positions 961 by a dashed square 960. (For the other pixel positions no such dashed line is shown for clarity.)

As also visible in FIG. 20, the corresponding Single-Centered Grid only contains a subset of the grid points 901, namely grid points 911 and 912. Pixel positions 911 and 912 (which respectively correspond to subgrids 107, 108 of the Single-Centered Grid shown in FIG. 19) are highlighted by closed and gray small circles, respectively. As can be seen in FIG. 20, the number of grid points addressable in the final grid, i.e. Single-Centered Grid, in region 900 is Ngrid2=2×(2×2)=8. Thus, the reduction factor is Ngrid1/Ngird2=2 in this example.

Once bitmap data (pixels) have been determined on the Double Grid of FIG. 20, which represents the accurate grid in this example, pixels values including gray shades are available for each pixel position 901 of the accurate grid. Those values are now mapped to the pixels 911, 912 of the Single-Centered Grid of FIG. 20, which represents the grid to be finally used during writing in the secondary region ('final grid').

FIG. 21 illustrates the Grid Reducer algorithm for the example of pixel grids of FIG. 20. Each pixel position 901 of the accurate grid is associated with an entry in matrix 921 which represents a gray shade corresponding to a real number between 0 and 1 (minimum and maximum dose levels). The matrix 921 of the Double Grid area 900 contains 4×4=16 pixel values with exemplary gray shade values. Within the algorithm "Grid Reducer", a reduction map kernel 988 is defined by the gray-shaded area. The size of the reduction map kernel 988 is such that it covers at least Nred pixels, corresponding to a reduction by the factor Nred. In the example shown, Nred=2; and the kernel 988 has size 2×2 but only Nred=2 entries are non-zero. One suitable choice for the reduction map kernel is the normalized sum of covered pixels (thus emulating the means of gray shades in the covered pixel area): $q' = \Sigma kq/\Sigma k$, where q symbolizes a gray shade of a pixel position in the accurate grid, k symbolizes an entry in the kernel, and both sums run over all entries in the kernel; q' is the gray value calculated for the final grid. For instance, with reference to FIG. 21, applying the kernel 988 to the gray shade values in the dashed square belonging to the position 931, will yield an averaged value at position 932 in the final grid.

When the number of pixels and their gray shades gets downsampled in such a way, normalization to one (maximum dose level with gray shades) is conserved. But the number of pixels is reduced by Nred and, correspondingly, the grid pitch is increased, and overlap of the aperture images is reduced correspondingly. Thus, also the current density delivered to the substrate is reduced by Nred. For keeping the delivered current density constant, the actually delivered dose per gray shade would need to be increased accordingly. In a MBW, this may be easily done by increasing the dwell time T1 and Tu (decreasing clock rate).

In the case that, on the other hand, the dose per gray shade is kept the same during such a process of reducing the grid size by downsampling (constant clock rate), the dose delivered is reduced by Nred, in the example, to half of the full dose and thus to the very edge of resist development.

A still further embodiment of the invention envisages exposing the frame pattern area 103 by using a beam size which is larger than the beam size 60 used to expose critical patterns in the substrate exposure area 102. In this case it has to be ensured that the larger beams formed by the Aperture Array Plate (AAP) can pass through the openings in the Deflection Array Plate (DAP) without obstruction. As an example, while a 20 nm beam size is used for critical pattern exposure, the frame area with non-critical patterns may be exposed using a 32 nm beam size. These dimensions on the target plane correspond with dimensions at the DAP (assuming a 200× reduction projection optics) where the larger beam size is 6.4 μm×6.4 μm, which is still small enough to pass through the 9 μm×9 μm openings in the DAP. The use of such larger beams again allows a faster writing speed, by a factor of about 2.5, of the frame pattern area with non-critical patterns. It is worthwhile to mention that the U.S. Pat. No. 8,546,767 B2 of the applicant describes an in-situ change of the beam size, e.g. from 20 nm to 32 nm, which is accomplished using a suitable positional adjustment of the AAP above the DAP.

Summarizing, the above embodiments of the invention can operate to reduce the duration needed for multi-beam writing of a pattern area with relaxed critical dimension while that the overall MBW writing time, even in the case of multi-beam exposure of a photomask substrate, is not significantly affected.

The invention claimed is:

1. A method for irradiating a target with a beam of energetic radiation formed by electrically charged particles for writing a desired pattern on said target, comprising
providing a pattern definition device having a plurality of apertures transparent to said radiation,
illuminating said pattern definition device using an illuminating wide beam, which traverses the pattern definition device through said apertures thus forming a patterned beam consisting of a corresponding plurality of beamlets,
forming said patterned beam into a pattern image on the location of the target, said pattern image comprising the images of at least part of the plurality of apertures covering a number of pattern pixels on the target, and
generating a relative movement between said target and the pattern definition device producing a stepwise movement of said pattern image on the target along a path over a region where a beam exposure is to be performed, exposing a plurality of pattern pixels in said region,
wherein the pattern comprises a primary pattern region and a secondary pattern region, the primary pattern region including structure features being written with a predetermined primary feature size whereas the secondary pattern region is composed of structure features capable of being written with a secondary feature size which is larger than the primary feature size by a factor of at least 2,
wherein writing structure features of the primary pattern region comprises exposing a plurality of exposure spots which are located on the target at respective grid positions of a first exposure grid in a regular arrangement, and writing structure features in the secondary pattern region comprises exposing a plurality of exposure spots which are located on the target at respective grid positions of a second exposure grid according to a second arrangement which is coarser that the regular arrangement of the first exposure grid.

2. The method of claim 1, wherein during writing structure features of the primary pattern region, the maximum exposure dose for an exposure spot located within the primary pattern region is greater than a dose value level which causes a positive exposure of the respective exposure spot, by a factor of 1.5 to 3.0,
whereas during writing structure features in the secondary pattern region, the maximum exposure dose of an exposure spot located within the secondary pattern region matches the dose value level which causes a positive exposure of the respective exposure spot.

3. The method of claim 2, wherein the maximum exposure dose includes effects of indirect exposure arising from the exposure of neighboring exposure spots, including electron backscattering effects.

4. The method of claim 3, wherein in regions that are intended to be exposed below a positive exposure, exposure spots are added an amount of exposure while remaining below said dose value level of positive exposure, for generating a background to effect indirect exposure for neighboring exposure spots.

5. The method of claim 4, wherein in said regions that are intended to be exposed below a positive exposure a dose value is written onto the target with said dose value not exceeding a first threshold value, whereas during writing structure features in the secondary pattern region, the maximum exposure dose of an exposure spot located within the secondary pattern region is greater than said first threshold value.

6. The method of claim 2, wherein during writing structure features of the primary pattern region, the maximum exposure dose for an exposure spot located within the primary pattern region is greater than a dose value level which causes a positive exposure of the respective exposure spot by a factor of approximately 2.

7. The method of claim 1, wherein writing exposure spots includes imparting an exposure dose to each exposure spot at a value in accordance with a pattern to be produced up to a maximum exposure dose, wherein calculating the values of exposure dose for the exposure spots in the secondary pattern region includes:
calculating first exposure dose values with regard to grid positions corresponding to the first exposure grid from the primary pattern region extended into the secondary pattern region, determining, for each exposure spot in the secondary region, a set of grid positions of the first exposure grid neighboring to the position of the respective exposure spot, and calculating, for each exposure spot in the secondary region, a respective second exposure value by applying a weighted sum over the first exposure values of the grid positions in the respective set of grid positions.

8. The method of claim 1, wherein the second exposure grid is based on a geometrical grid which is a subset of a geometrical grid on which the first exposure grid is based.

9. The method of claim 8, wherein the second exposure grid is based on a geometrical grid which is a subset of a geometrical grid on which the first exposure grid is based, and the number of grid positions in the second exposure grid per unit area is smaller than the number of grid positions in the first exposure grid by a factor n, where n≥2 is an integer number.

10. The method of claim 9, wherein n is a power of 2.

11. The method of claim 1, wherein for writing structure features in the primary pattern region and in the secondary pattern region, respectively, different types of apertures in the pattern definition device are used, where the apertures used with the primary pattern region have smaller areas than the apertures used with the secondary pattern regions.

12. The method of claim 11, wherein the apertures used with the primary pattern region have smaller areas than the apertures used with the secondary pattern regions by a factor of two or a power of two.

13. The method of claim 1, wherein for writing structure features in the secondary pattern region, the pattern image is moved on the target along a path within the secondary pattern region, the movement along said path defining a number of stripes covering said region in sequential exposures, said path being composed of sections which each extend along one of several general directions which are mutually different.

14. The method of claim 13, wherein said path is composed of sections which each extend along one of several, perpendicular, directions.

* * * * *